US008111541B2

(12) United States Patent
Lai et al.

(10) Patent No.: US 8,111,541 B2

(45) **Date of Patent: *Feb. 7, 2012**

(54) METHOD OF A MULTI-LEVEL CELL RESISTANCE RANDOM ACCESS MEMORY WITH METAL OXIDES

(75) Inventors: Erh-Kun Lai, Taichung County (TW); ChiaHua Ho, Kaoshing (TW); Kuang Yeu Hsieh, Ju Bai (TW)

(73) Assignee: Macronix International Co., Ltd., Hsinchu (TW)

(*) Notice: Subject to any disclaimer, the term of this patent is extended or adjusted under 35 U.S.C. 154(b) by 79 days.

This patent is subject to a terminal disclaimer.

(21) Appl. No.: 12/715,888

(22) Filed: Mar. 2, 2010

(65) Prior Publication Data

US 2010/0216279 A1 Aug. 26, 2010

Related U.S. Application Data

(62) Division of application No. 11/567,978, filed on Dec. 7, 2006, now Pat. No. 7,697,316.

(51) Int. Cl.
*G11C 11/00* (2006.01)

(52) U.S. Cl. .............. 365/148; 365/46; 365/55; 365/74; 365/97; 365/100; 365/131; 365/158; 365/171; 365/173; 365/163

(58) Field of Classification Search .................... 365/46, 365/55, 74, 97, 100, 131, 148, 158, 171, 365/173, 163
See application file for complete search history.

(56) References Cited

U.S. PATENT DOCUMENTS 3,271,591 A 9/1966 Ovshinsky
3,530,441 A 9/1970 Ovshinsky
4,599,705 A 7/1986 Holmberg et al.
4,719,594 A 1/1988 Young et al.
4,876,220 A 10/1989 Mohsen et al.
5,166,096 A 11/1992 Cote et al.

(Continued)

FOREIGN PATENT DOCUMENTS

WO 0079539 A1 12/2000

(Continued)

OTHER PUBLICATIONS

Adler, David, "Amorphous-Semiconductor Devices," Sci. Amer., vol. 236, pp. 36-48, May 1977.

(Continued)

*Primary Examiner* — Fernando Hidalgo
(74) *Attorney, Agent, or Firm* — Warren S. Wolfeld; Haynes Beffel & Wolfeld LLP

(57) ABSTRACT

A method and structure of a bistable resistance random access memory comprise a plurality of programmable resistance random access memory cells where each programmable resistance random access memory cell includes multiple memory members for performing multiple bits for each memory cell. The bistable RRAM includes a first resistance random access member connected to a second resistance random access member through interconnect metal liners and metal oxide strips. The first resistance random access member has a first resistance value Ra, which is determined from the thickness of the first resistance random access member based on the deposition of the first resistance random access member. The second resistance random access member has a second resistance value Rb, which is determined from the thickness of the second resistance random access member based on the deposition of the second resistance random access member.

18 Claims, 19 Drawing Sheets

U.S. PATENT DOCUMENTS

| | | | |
|---|---|---|---|
| 5,166,758 | A | 11/1992 | Ovshinsky et al. |
| 5,177,567 | A | 1/1993 | Klersy et al. |
| 5,534,712 | A | 7/1996 | Ovshinsky et al. |
| 5,687,112 | A | 11/1997 | Ovshinsky |
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,154,390 | A | 11/2000 | Yang |
| 6,177,317 | B1 | 1/2001 | Huang et al. |
| 6,178,114 | B1 | 1/2001 | Yang |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,859,389 | B2 | 2/2005 | Idehara |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 7,042,001 | B2 | 5/2006 | Kim et al. |
| 7,132,675 | B2 | 11/2006 | Gilton |
| 7,190,614 | B2 | 3/2007 | Wu |
| 7,251,156 | B2 | 7/2007 | Boeve |
| 2004/0160820 | A1* | 8/2004 | Rinerson et al. .............. 365/171 |
| 2004/0248339 | A1 | 12/2004 | Lung |
| 2005/0093022 | A1 | 5/2005 | Lung |
| 2005/0215009 | A1 | 9/2005 | Cho |
| 2005/0219892 | A1 | 10/2005 | Lai et al. |
| 2007/0045704 | A1 | 3/2007 | Ufert |

FOREIGN PATENT DOCUMENTS

| | | |
|---|---|---|
| WO | 0145108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., Oum-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
"Magnetic Bit Boost," www.sciencenews.org, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, http://klabs.org/richcontent/MAPLDCon99/Papers/P21_Tyson_P.PDF#search='nonvolatie%20high%20density%20high%20performance%20phase%20change%20memory', 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
U.S. Appl. No. 11/381,973, filed May 5, 2006 by ChiaHua Ho et al.
U.S. Appl. No. 11/426,213, filed Jun. 23, 2006 by ChiaHua Ho et al.
U.S. Appl. No. 11/457,702, filed Jul. 14, 2006 by ChiaHua Ho.
U.S. Appl. No. 11/461,103, filed Jul. 31, 2006 by ChiaHua Ho et al.
U.S. Appl. No. 11/552,433, filed Oct. 24, 2006 by ChiaHua Ho et al.
U.S. Appl. No. 11/555,849, filed Nov. 2, 2006 by Wen Chiao Ho et al.
U.S. Appl. No. 11/614,916, filed Dec. 21, 2006 by Chao-I Wu.
U.S. Appl. No. 11/617,542, filed Dec. 28, 2006 by Erh Kun Lai et al.
U.S. Appl. No. 11/670,382, filed Feb. 1, 2007 by Chun Jen Huang et al.
U.S. Appl. No. 11/552,464, filed Oct. 24, 2006 by ChiaHua Ho et al.

* cited by examiner

100

1200

METHOD OF A MULTI-LEVEL CELL RESISTANCE RANDOM ACCESS MEMORY WITH METAL OXIDES

RELATED APPLICATIONS

This application is a divisional of U.S. application Ser. No. 11/567,978 filed 7 Dec. 2006, now U.S Pat. No. 7,697,316, herein incorporated by reference, which relates to U.S. patent application Ser. No. 11/552,464, now U.S. Pat. No. 7,388,771 entitled "Methods of Operating a Bistable Resistance Random Access Memory with Multiple Memory Layers and Multilevel Memory States" by ChiaHua Ho et al., owned by the assignee of this application and incorporated herein by reference; and U.S. patent application Ser. No. 11/552,433, entitled "Bistable Resistance Random Access Memory Structures with Multiple Memory Layers and Multilevel Memory States" by ChiaHua Ho et al., owned by the assignee of this application and incorporated herein by reference.

BACKGROUND OF THE INVENTION

1. Field of the Invention

The present invention relates to high density memory devices based on programmable resistance memory materials, including metal-oxide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause the transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. As demand for greater memory capacity is sought, a phase change memory that stores multiple bits per memory layer would be highly desirable.

SUMMARY OF THE INVENTION

A bistable resistance random access memory (RRAM) is described suitable for use in multi-level cell memory integrated circuits. The bistable resistance random access memory comprises a plurality of programmable resistance random access memory cells where each programmable resistance random access memory cell includes multiple resistance random access memory members or segments for performing multiple bits for each memory cell. Technologies described herein include a first resistance random access member connected to a second resistance random access member through interconnect metal liners and metal oxide strips. The first resistance random access member has a first resistance value Ra, which is determined from the thickness of the first resistance random access member based on the deposition of the first resistance random access member. The second resistance random access member has a second resistance value Rb, which is determined from the thickness of the second resistance random access member based on the deposition of the second resistance random access member. The total resistance Rs of the resistance random access memory cell is computed as follows, $Rs=(Ra+Rb)/2$. The resistances Ra and Rb are a function of the thickness of a respective metal oxide strip measured vertically, represented by a symbol MLa or a symbol MLb, and the thickness of a respective metal oxide strip measured horizontally, represented by a symbol MLOXa or a symbol MLOXb. The symbol MLa is also approximately equal to the thickness during the deposition of the first programmable resistance random access member. The MLb is also approximately equal to the thickness during the deposition of the second programmable resistance random access member. In mathematical representations, $Ra \approx MLOXa/MLa$, $Rb \approx MLOXb/MLb$. Therefore, the thinner the MLa and the greater oxidation MLOXa, the larger the resistance Ra value will be. Similarly, the thinner the MLb and the greater oxidation MLOXb, the larger the resistance Rb value will be. The total resistance Rs can be adjusted by the amount of deposition of the first resistance random access member, MLa, which determines the thickness of the first resistance random access member, or by the amount of deposition of the second resistance random access member, MLb, which determines the thickness of the second resistance random access member.

Alternatively, the metal liners that interconnect between the first resistance random access member and the second resistance random access member can be implemented as metal oxides. In this embodiment, the total resistance Rs is computed as follows: $Rs=(Ra+Rb+Rc)/2$, where the symbol Rc denotes the resistance value of the metal oxides that interconnect between the first resistance random access member and the second resistance random access member.

Suitable materials for the first programmable resistance random access memory layer, the second programmable resistance random access memory layer, or additional programmable resistance random access memory layers include, but are not limited to, a metal oxide, a colossal magnetoresistance (CMR) material, a three-element oxide, a phase-change material and a polymer-based material. The RRAM material for the first programmable resistance random access memory layer can be selected to be the same or different from the RRAM material for the second programmable resistance random access memory layer.

A method for manufacturing a bistable resistance random access memory with multiple resistance random access memory members is also described. The deposition of a first programmable resistance random access memory layer, an insulating layer, a second programmable resistance random access member layer, and a cap layer are carried out such that it is desirable to deposit a first programmable resistance random access memory layer which is thin, deposit the insulating layer which is thin, and deposit a second programmable resistance random access memory layer which is thin. These layers are patterned to form a first programmable resistance random access memory member or segment, an insulating member or segment, a second programmable resistance random access member or segment, and a cap member or segment. The first programmable resistance random access memory member and the second programmable resistance random access memory member are oxidized to form metal oxide strips on edges of the first programmable resistance random access memory member and the second programmable resistance random access memory member. To obtain a larger resistance Ra, the oxidation duration of MLOXa should be longer, and to obtain a larger resistance Rb, the oxidation duration of MLOXb should be longer. Metal liners are formed adjacent to the metal oxide strips on each side of the first programmable resistance random access member and the second programmable resistance random access member for interconnecting electrically the first programmable resistance random access member and the second programmable resistance random access member.

Broadly stated, a method of forming a multi-level cell resistance random access memory structure comprises depositing a first programmable resistive memory member having a thickness $t_1$, the first programmable resistive memory member having a resistance Ra, the resistance Ra correlating with the thickness $t_1$ of the first programmable resistance random access memory member; forming an insulating member over the first programmable resistance random access memory member; depositing a second programmable resistive memory member having a thickness $t_2$, the second programmable resistive memory member having a resistance Rb, the resistance Rb correlating with the thickness $t_2$ of the second programmable resistive memory member; and oxidizing the first programmable resistive memory member to form a first metal oxide strip at a first position of the first programmable resistive memory member and form a second metal oxide strip at a second position of the first programmable resistance random access memory member, the first metal liner having a vertical thickness MLa and a horizontal thickness MLOXa.

Advantageously, the present invention increases the overall density of a bistable resistance random access memory by employing multiple resistance random access memory members. The present invention also provides a three-dimensional solution for the design and manufacture of bistable resistance random access memories.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
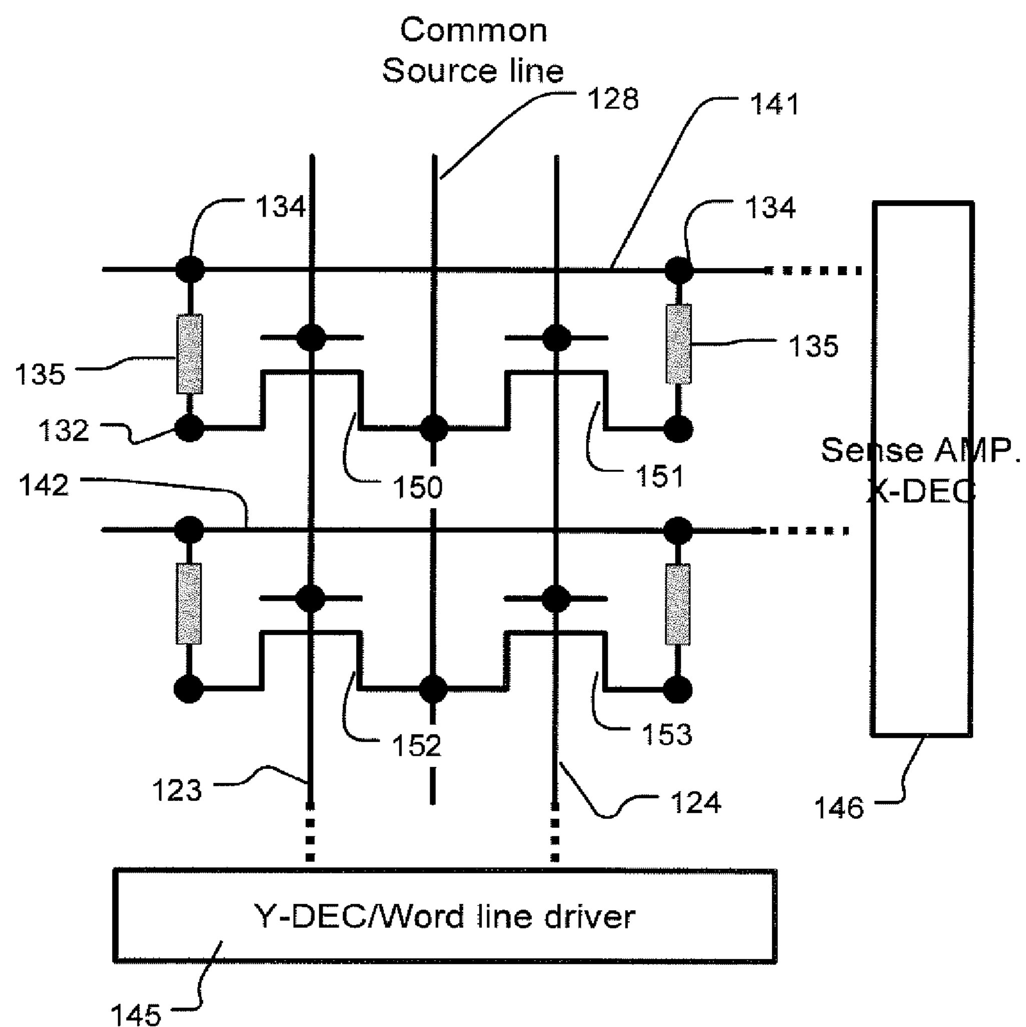
FIG. 1 is a schematic illustration of a memory array in accordance with the present invention.

A description of structural embodiments and methods of the present invention is provided with reference to FIGS. 1-18. It is to be understood that there is no intention to limit the invention to the specifically disclosed embodiments but that the invention may be practiced using other features, elements, methods and embodiments. Those of ordinary skill in the art will recognize a variety of equivalent variations on the description that follows. Like elements in various embodiments are commonly referred to with like reference numerals.

FIG. 1 is a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for sidewall pin memory cell 135, which has top electrode member 134 and bottom electrode member 132. The top electrode member 134 is coupled to the bit line 141. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
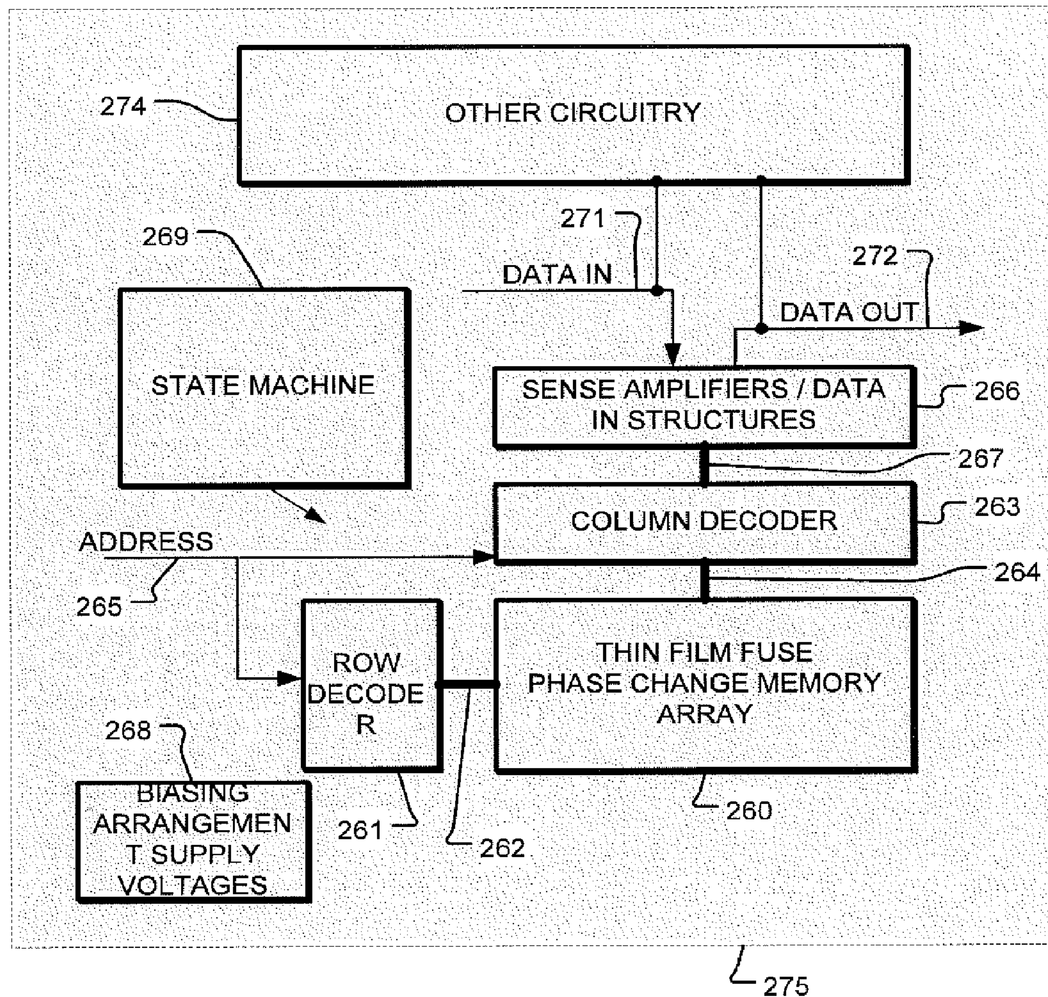
FIG. 2 is a simplified block diagram of an integrated circuit of an RRAM architecture according to an embodiment of the present invention.

FIG. 2 is a simplified block diagram of an integrated circuit 200 of an RRAM architecture according to an embodiment of the present invention. The integrated circuit 275 includes a memory array implemented using sidewall active pin bistable resistance random access memory cells on a semiconductor substrate. A row decoder 261 is coupled to a plurality of word lines 262 arranged along rows in the memory array 260. A pin decoder 263 is coupled to a plurality of bit lines 264 arranged along pins in the memory array 260 for reading and programming data from the sidewall pin memory cells in the memory array 260. Addresses are supplied on a bus 265 to a pin decoder 263 and a row decoder 261. Sense amplifiers and data-in structures in a block 266 are coupled to the pin decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry 274 is included on the integrated circuit, such as a general-purpose processor or special purpose application circuitry, or a combination of modules providing system-on-a-chip functionality supported by the thin film bistable resistance random access memory cell array. Data is supplied via the data-out line 272 from the sense amplifiers in block 266 to input/output ports on the integrated circuit 275, or to other data destinations internal or external to the integrated circuit 275.

A controller utilized in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
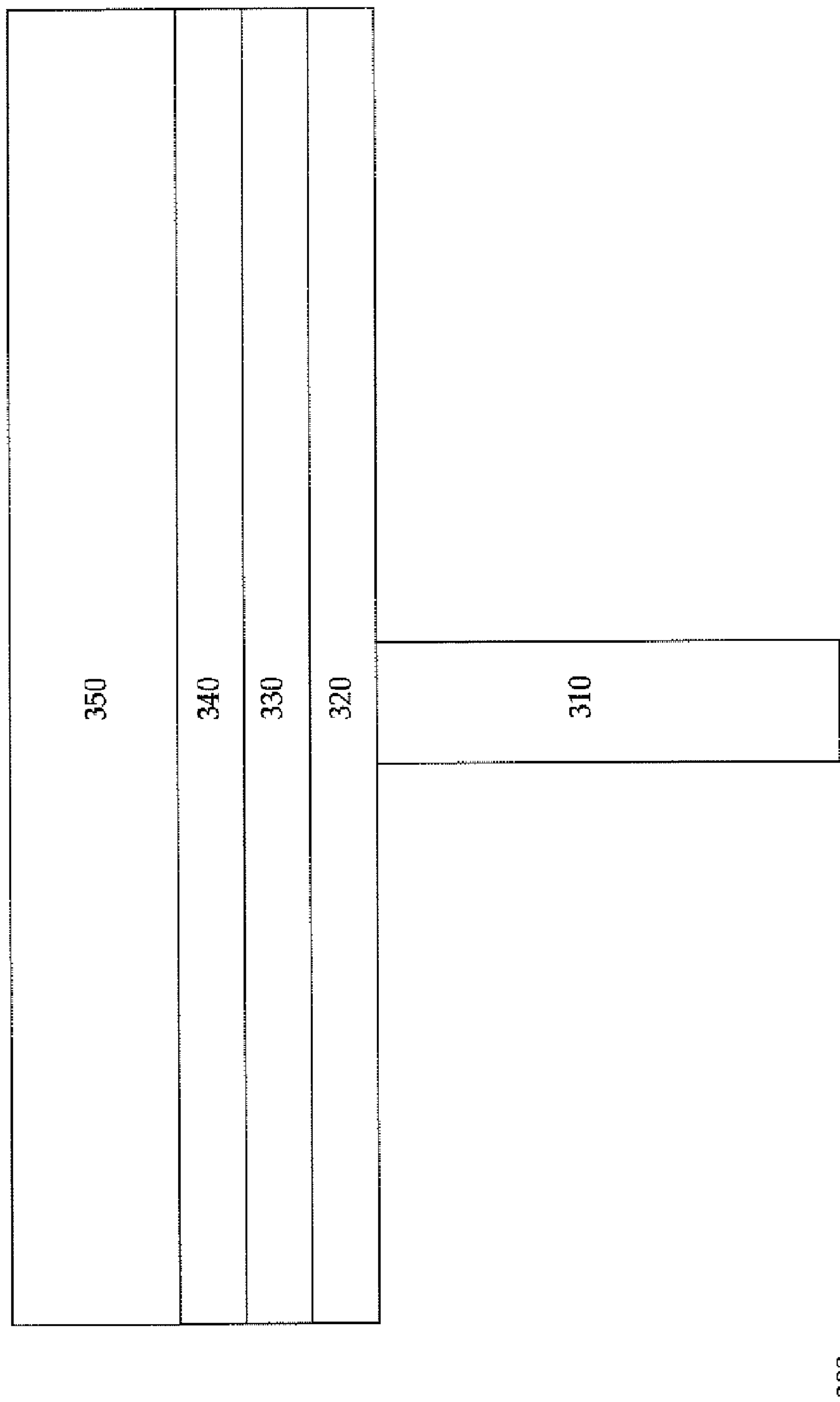
FIG. 3 is a simplified process diagram showing a reference step of a simplified structure in the manufacturing of a bistable resistance random access memory with the deposition of inter-layer dielectric or inter-metal dielectric and layers deposited over the inter-layer dielectric in accordance with the present invention.

FIG. 3 is a simplified process diagram showing a reference step of a simplified structure 300 in the manufacture of a bistable resistance random access memory with the deposition of inter-layer dielectric (ILD) 310 or inter-metal dielectric (IMD) and layers deposited over the inter-layer dielectric. Suitable materials for implementing the inter-layer dielectric 310 include a metal line plug, copper Cu or tungsten W. A first metal line layer ML-A (or first programmable resistance random access layer) 320 is deposited over the inter-layer dielectric 310. The first metal line layer ML-A 320 can be implemented using either Aluminum Al, Tungsten W, Titanium Ti or Nickel Ni. The thickness of the first metal line layer ML-A 320 is preferably as thin as possible. In one embodiment, the thickness of the first metal line layer ML-A 320 is in the range of 50 to 100 Å. In another embodiment, the thickness of the first metal line layer ML-A 320 is 50 Å or less. An insulator layer 330 is deposited over the first metal line layer ML-A 330. Exemplary materials for manufacturing the insulator layer 330 include Oxide (OX) and Silicon Nitride (SiN). The thickness of the insulator layer 330 is preferably as thin as possible. In one embodiment, the thickness of the insulator layer 330 is in the range of 50 to 100 Å. In another embodiment, the thickness of the insulator layer 330 is 50 Å or less. The deposition of a second metal line layer ML-B (or second programmable resistance random access member) 340 is conducted to place the second metal line layer ML-B 340 over the insulator layer 330. Suitable materials for manufacturing the second metal line layer ML-B 340 comprise Al, W, Ti or Ni. The thickness of the second metal line layer ML-B 340 is preferably as thin as possible. In one embodiment, the thickness of the second metal line layer ML-B 340 is in the range of 50 to 100 Å. In another embodiment, the thickness of the second metal line layer ML-B 340 is 50 Å or less. A cap layer 350 is deposited over the second metal line layer ML-B 350. The cap layer 350 comprises a conductive material including Ti, TiN, TiN/W/TiN, TiN/Ti/Al/TiN, n+ polysilicon, TiON, Ta, TaN, TaON and others.

The term "bistable RRAM" refers to the control of a resistance level by one of the follow means: a voltage amplitude, a current amplitude or the electrical polarity. The state controlling of a phase-change memory is conducted by the voltage amplitude, the current amplitude, or the pulse time. The electrical polarity of the bistable RRAM does not affect the programming of the bistable RRAM.

The following are short summaries describing four types of resistive memory material suitable for implementing an RRAM. A first type of memory material suitable for use in embodiments is colossal magnetoresistance ("CMR") material, such as $Pr_xCa_yMnO_3$ where x:y=0.5:0.5, or other compositions with x:0~1; y:0~1. CMR material that include Mn oxide are alternatively used.

An exemplary method for forming CMR material involves the use of PVD sputtering or magnetron-sputtering method with source gases of Ar, $N_2$, $O_2$, and/or He, etc. at a pressure of 1 mTorr~100 mTorr. The deposition temperature can range from room temperature to ~600° C., depending on the post-deposition treatment condition. A collimater with an aspect ratio of 1~5 can be used to improve the fill-in performance. To improve the fill-in performance, the DC bias of several tens of volts to several hundreds of volts is also used. On the other hand, DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an annealing time of less than 2 hours.

The thickness of CMR material depends on the design of the cell structure. A CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A second type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x: 0.5; y=0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimater with an aspect ratio of 1~5 can be used to improve the fill-in performance. To improve the fill-in performance, DC bias of several tens of volts to several hundreds of volts is also used. If desired, DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimater with an aspect ratio of 1~5 can be used to improve the fill-in performance. To improve the fill-in performance, a DC bias of several tens of volts to several hundreds of volts is also used. If desired, DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A third type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat, a Ta-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an annealing time of less than 1 hour.

Another technique for forming a layer of polymer-based memory material is using a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

A fourth type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering with source gas(es) of Ar, $N_2$, and/or He, etc. at a pressure of 1 mTorr~100 mTorr. The deposition is usually performed at room temperature. A collimater with an aspect ratio of 1~5 can be used to improve the fill-in performance. To improve the fill-in performance, a DC bias of several tens of volts to several hundreds of volts is also used. On the other hand, DC bias and the collimater can be used simultaneously.

A post-deposition annealing treatment in vacuum or in an $N_2$ ambient is optionally performed to improve the crystallized state of chalcogenide material. The annealing temperature typically ranges from 100° C. to 400° C. with an annealing time of less than 30 minutes. The thickness of chalcogenide material depends on the design of the cell structure. In general, a chalcogenide material with a thickness of higher than 8 nm can have a phase change characterization such that the material exhibits at least two stable resistance states.

Figure 9:
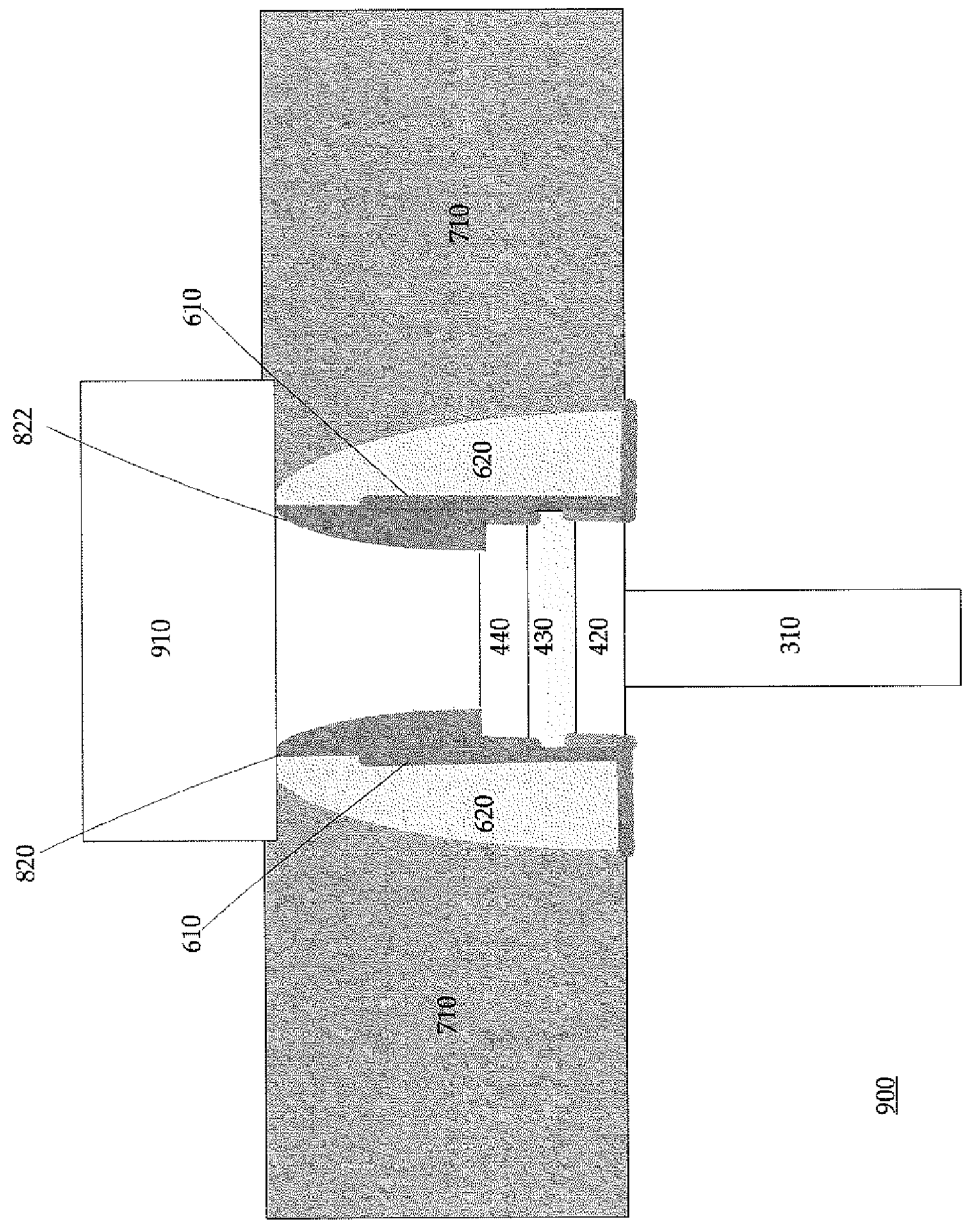
FIG. 9 is a process diagram illustrating the seventh step in the manufacturing of the bistable resistance random access memory with the deposition and patterning of a conductive material in accordance with the present invention.

Embodiments of the memory cell in the bistable RRAM (as shown in FIG. 9) may include phase change based memory materials, including chalcogenide based materials and other materials, for the first resistance random access memory layer 320 and the second resistance random access memory layer 340. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE v.*3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 patent at columns 11-13, which examples are hereby incorporated by reference.

Phase change alloys can be switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, $ZrO_x$, $WO_x$, $TiO_x$, $AlO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

Each of the first and second resistance random access memory layers 320, 340 is formed from a material that includes at least two stable resistance levels, referred to as resistance random access memory material. Several materials have proved useful in fabricating RRAM, as described below.

Figure 4:
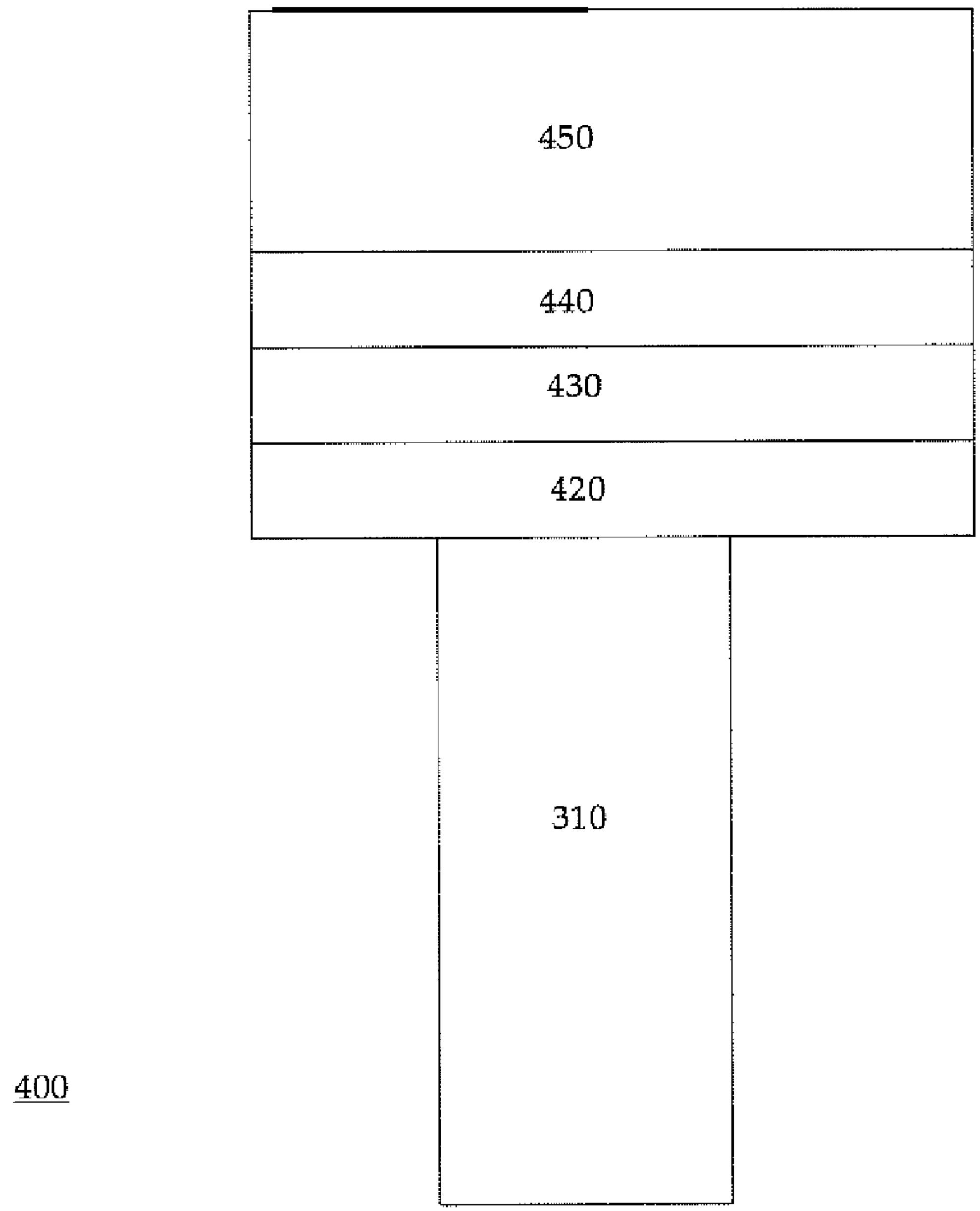
FIG. 4 is a simplified process diagram showing the next step, i.e. the second step assuming that the reference step represents the first step, in the manufacturing of a bistable resistance random access memory with a photolithographic patterning of the structure in accordance with the present invention.

FIG. 4 is a simplified process diagram showing the next step, i.e. the second step assuming that the reference step represents the first step, in the manufacturing of the bistable resistance random access memory with a photolithographic patterning of the structure 300. The photolithographic patterning etches away each side of the cap layer 350, the second metal line layer ML-B 340, the insulator layer 330, and the first metal line layer ML-B 310, to produce reduced lengths in a cap segment (or cap member) 450 overlying the second metal line segment (or second programmable resistance random access member) ML-B 440, which overlays the insulator segment (or insulator member) 430, which overlays the first metal line segment (or first programmable resistance random access member) ML-A 420. A pillar 400 is formed from the inter-layer dielectric 310, and the plurality of segments which includes the cap segment 450, the second metal line segment ML-B 440, the insulator segment 430 and the first metal line segment ML-A 420. The diameter of the pillar 400 ranges from about 50 nm to about 500 nm, where 100 nm is selected in one exemplary implementation. The thickness of the ML-A layer 420, which is made of a conductor material such as metal oxide can be used as RRAM material, ranges from about 50 Å to about 1000 Å, where 200 Å is selected in one exemplary embodiment. The thickness of dielectric or insulator layer 430 ranges from about 100 Å to about 1000 Å, where 200 Å is selected in one exemplary embodiment. The thickness of ML-B layer 440 ranges from about 50 Å to about 1000 Å, which is made of a conductive material such as metal oxide can be used as RRAM material, wherein 200 Å is selected in one exemplary embodiment. The cap layer 450 can be implemented with a higher selectivity material to oxide during CMP planarization, with a thickness that ranges from about 500 Å to about 2000 Å, where 1000 Å is selected in one exemplary implementation.

Figure 5:
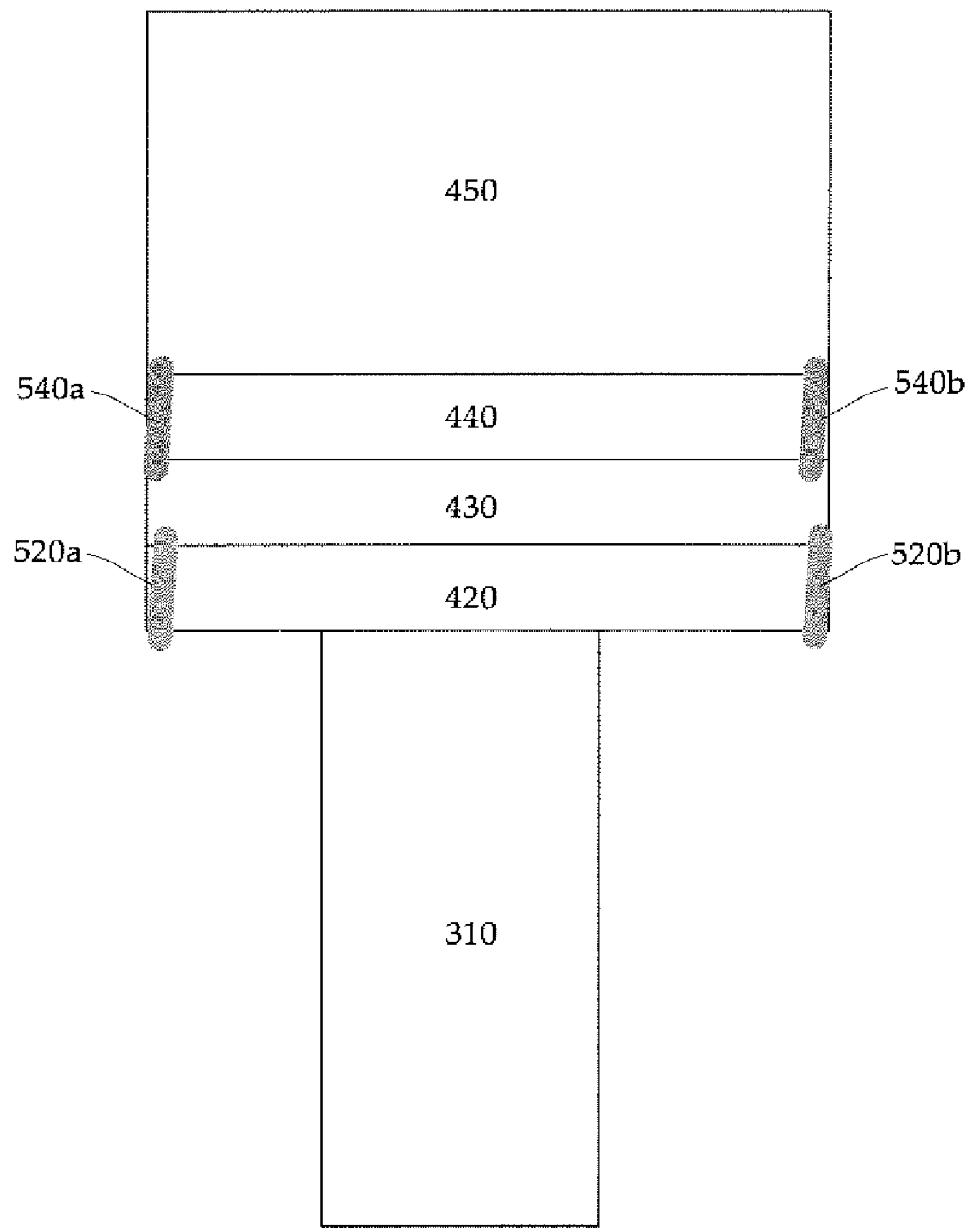
FIG. 5 is a process diagram illustrating the third step in the manufacturing of the bistable resistance random access memory with oxidation to form metal line oxides in accordance with the present invention.

FIG. 5 is a process diagram illustrating the third step in the manufacturing of the bistable resistance random access memory with oxidation to form metal line oxides. The oxidation of the first metal line segment ML-A 420 and the second metal line segment ML-B 440 causes metal oxide strips 520*a* and 520*b* to be formed on a first edge and a second edge of the first metal line segment ML-A 420, and causes metal oxide strips 540*a* and 540*b* to be formed on the first edge and the second edge of the second metal line segment ML-B 440, where the first edge is spaced apart from the second edge. A typical thickness of the metal oxide strips 520*a* and 520*b* and metal oxide strips 540*a* and 540*b* ranges from 50 to 100 Å. Suitable oxidation techniques include plasma oxidation or a furnace process for oxidizing the first metal line segment ML-A 420 and the second metal line segment ML-B 440.

Figure 6A:
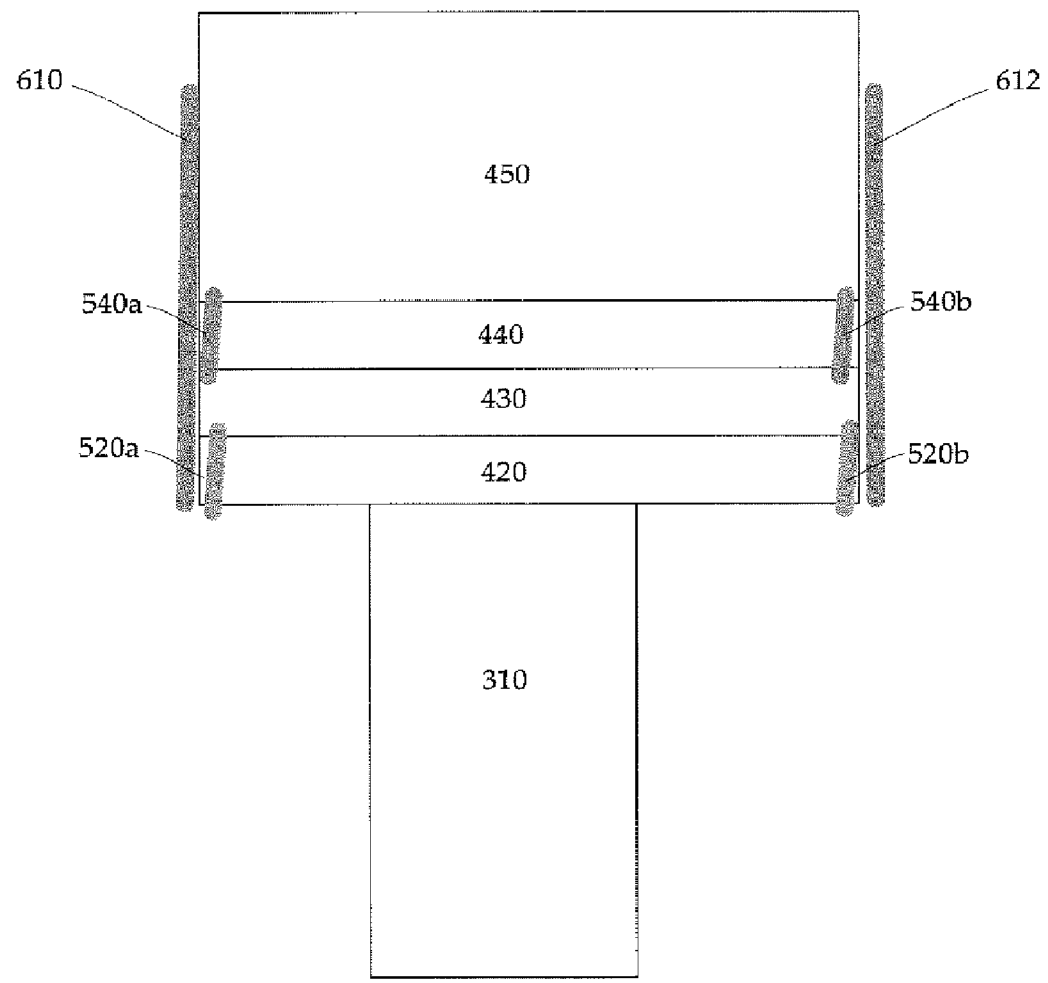
FIG. 6A is a process diagram illustrating the fourth step in the manufacturing of the bistable resistance random access memory with the deposition of interconnect metal lines according to a first embodiment of the invention.
Figure 6B:
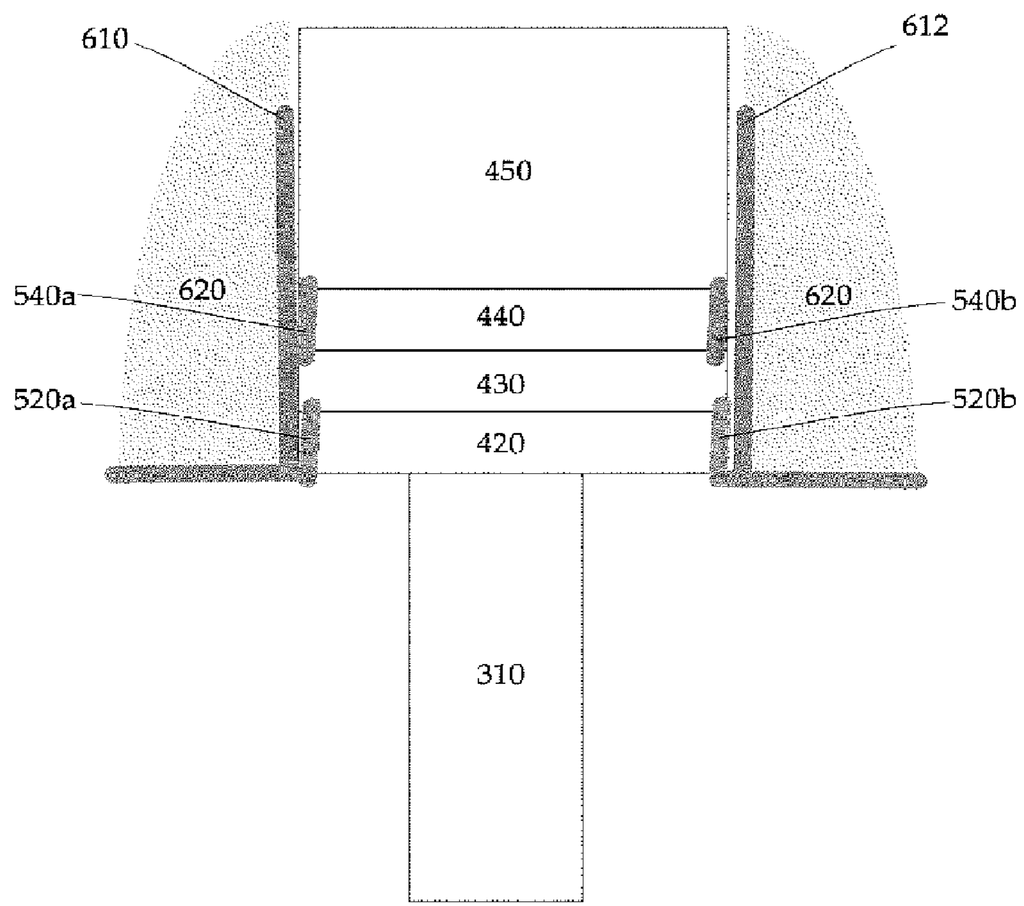
FIG. 6B is a process diagram illustrating the fourth step in the manufacturing of the bistable resistance random access memory with the deposition of the interconnect metal lines and spacers according to a second embodiment of the invention.

FIG. 6A is a process diagram illustrating the fourth step in the manufacture of the bistable resistance random access memory with the deposition of interconnect metal liners 610, 612 according to a first embodiment of the invention. The interconnect metal liners 610, 612 are deposited respectively along vertical edges of the cap segment 450, the second metal line segment ML-B 440, the insulator segment 430 and the first metal line segment ML-A 420. The first interconnect metal liner 610 electrically connects between the metal oxide strip 540*a* and the metal oxide strip 520*a*. The second interconnect metal liner 610 electrically connects between the metal oxide strip 540*b* and the metal oxide strip 520*b*. In an alternative embodiment as shown in FIG. 6B, there is shown the fourth step in the manufacture of the bistable resistance random access memory with the deposition of the interconnect metal liners 610, 612 and insulators 620, 622 according to a second embodiment of the invention. An insulator material, such as oxide, is deposited over the interconnect metal liners 610, 612, and the insulator material is etched to form an L-shaped spacer 620.

Figure 7:
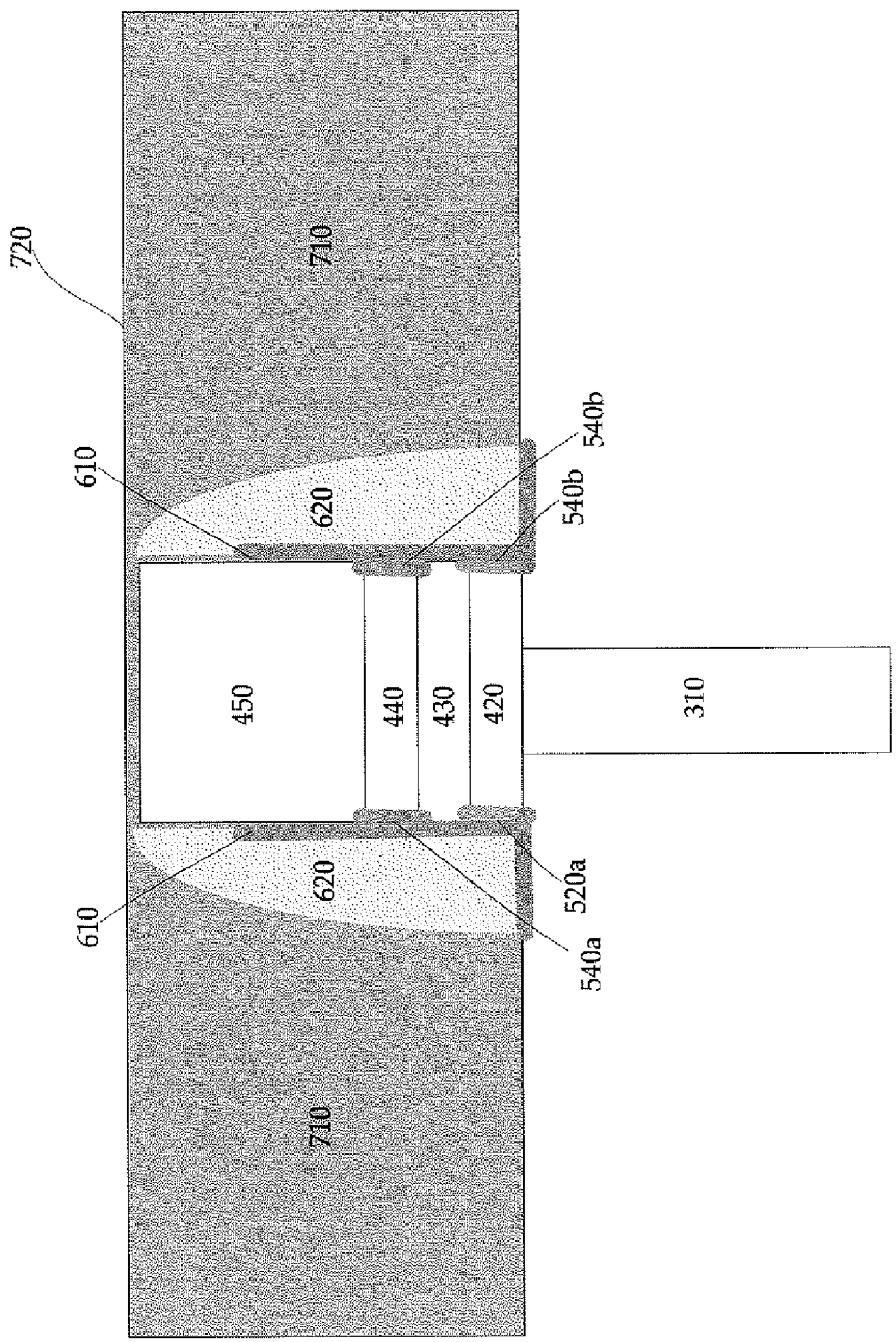
FIG. 7 is a process diagram illustrating the fifth step in the manufacturing of the bistable resistance random access memory with the deposition of inter-metal dielectric and a polishing process in accordance with the present invention.

FIG. 7 is a process diagram illustrating the fifth step in the manufacture of the bistable resistance random access memory with the deposition of inter-metal dielectric and a polishing process. An inter-metal dielectric 710 is deposited around the spacer 620 and over the cap segment 450. The top surface 720 of the inter-metal dielectric 710 is polished and planarized by a chemical mechanical polishing (CMP) process.

Figure 8:
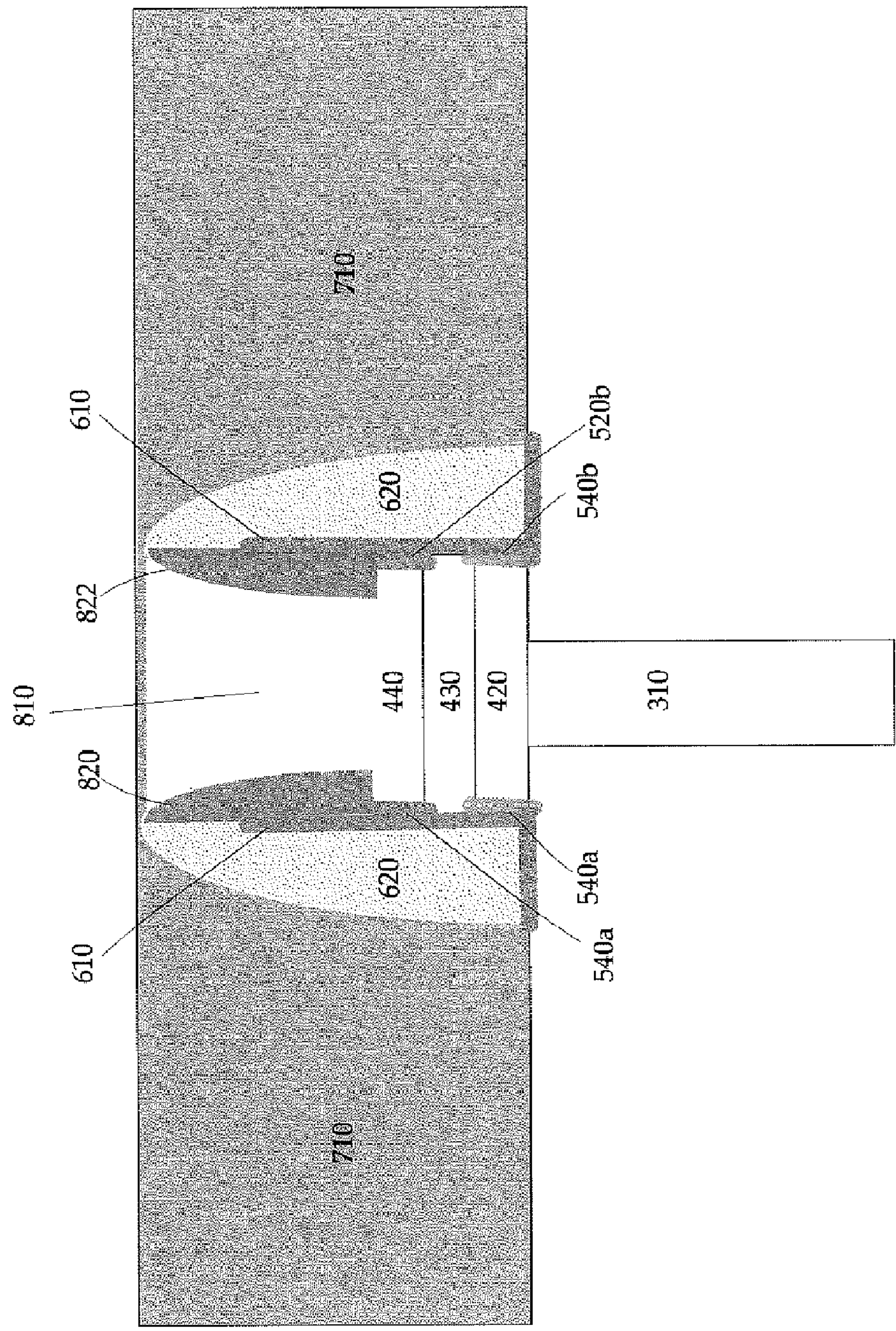
FIG. 8 is a process diagram illustrating the sixth step in the manufacturing of the bistable resistance random access memory with the removal of the cap segment and formation of a spacer in accordance with the present invention.

FIG. 8 is a process diagram illustrating the sixth step in the manufacture of the bistable resistance random access memory with the removal of the cap segment and formation of a spacer. The material representing the cap segment 450 is removed leaving a void 810. An insulator material, such as an oxide, is deposited into the void 810, and the insulator material is etched to form oxide liners or oxide spacers 820, 822. The oxide spacers 820, 822 serve to insulate the interconnect metal liners 610, 612 from being shorted with a subsequent deposit of a conductive material. A suitable thickness for the oxide spacers 820, 822 is about 200 Å.

FIG. 9 is a process diagram illustrating the seventh step in the manufacture of the bistable resistance random access memory 900 with the deposition and patterning of a conductive material 910. The conductive material 910 is deposited into the void 810, adjacent to the oxide spacers 820, 822, and over a portion of the top surface of the inter-metal dielectric 710.

Figure 10:
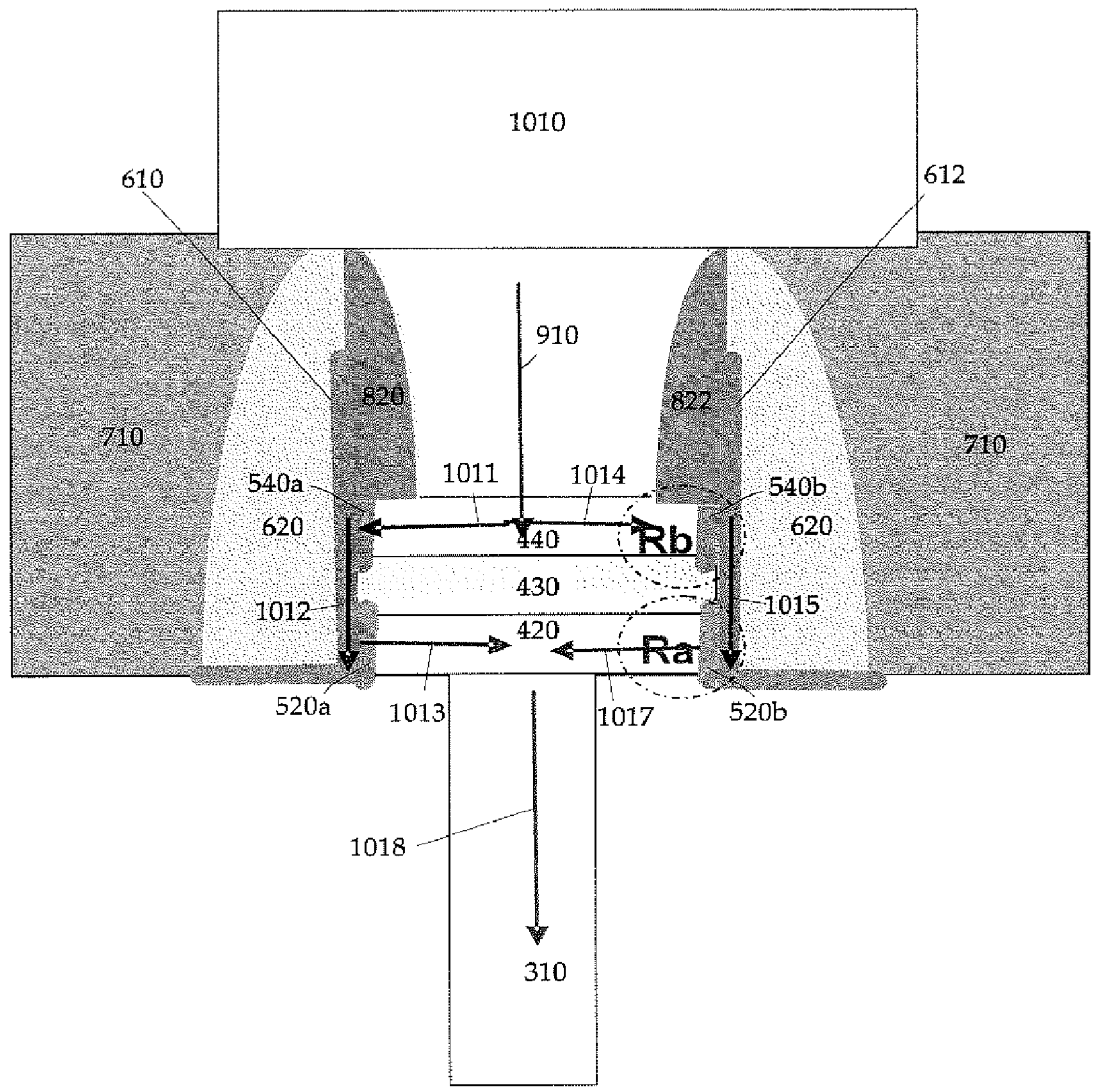
FIG. 10 is a process diagram of the bistable resistance random access memory with directional flows of an electrical current in accordance with the present invention.

FIG. 10 is a process diagram of the bistable resistance random access memory with directional flows of an electrical current 1010. In this illustration, the electrical current 1010 flows through the conductive material 1010 to the second metal line segment ML-B 440. As the electrical current 910 enters the second metal line segment ML-B 440, the electrical current 1010 splits into a first current flow as shown by an arrow 1011 and a second current flow as shown by an arrow 1014 due to the insulator segment 430 separating the second metal line segment ML-B 440 and the first metal line segment ML-A 420, where the direction flow of the first current flow is opposite of the second current flow. The resistance of the second metal line segment ML-B 440 is represented by the symbol Rb. The total resistance, represented by the symbol Rs, is calculated as follows: Rs=Ra+Rb/2. The second metal line segment ML-B 440 is connected to metal oxide strip 540*a* at a first position, which is connected to the interconnect metal liner 610. The first current flow as depicted by the arrow 1011 from the second metal line segment ML-B 440 flows through the metal oxide strip 540*a*, and down the interconnect metal liner 610. The second metal line segment ML-B 440 is connected to the metal oxide strip 540*b* at a second position, which is connected to the interconnect metal line 612, where the first position is spaced apart from the second position. The second current flow as depicted by the arrow 1014 from the second metal line segment ML-B 440 flows through the metal oxide strip 540*b*, and down the interconnect metal line 612 as shown by arrow 1015.

Other embodiments of the invention include depositing interconnect metal oxides instead of interconnect metal liners 610, 612. In these embodiments, metal oxides would be taken into account in computing the total resistance Rs, which is calculated as follows: Rs=(Ra+Rb+Rc)/2.

The resistance of the first metal line segment ML-A 420 is represented by the symbol Ra. The first metal line segment ML-A 420 is connected to the metal oxide strip 520*a* on at a first position, which is connected to the interconnect metal liner 610. The first metal line segment ML-A 420 is connected to the metal oxide strip 520*b* at a second position, which is spaced apart from the first position and connected to the interconnect metal line 612. The downward current on a first side as depicted by arrow 1012 flows through the metal oxide strip 520*a* and through the first side of the first metal line segment ML-A 420. The downward current on a second side as depicted by arrow 1015 flows through the metal oxide strip 520*b* and through the second side of the first metal line segment ML-A 420, where the first side is spaced apart from the second side.

As described above, the electrical current 1010 diverges at the second metal segment ML-B 440 by branching west bound with a first portion of current 1011, and branching east bound with a second portion of current 1014. The first portion of current 1011 flows downward through the interconnect metal liner 610 as depicted by arrow 1012, and the second portion of current 1014 flows downward through the interconnect metal line 612 as shown by arrow 1015. The first portion of current 1011 and the second portion of current 1014 converge at the first metal segment ML-A 420 as depicted by arrows 1013 and 1017 respectively, and exit from the first metal segment ML-A 420 as a single current as depicted by arrow 1018 to inter-layer dielectric 310.

Figure 11:
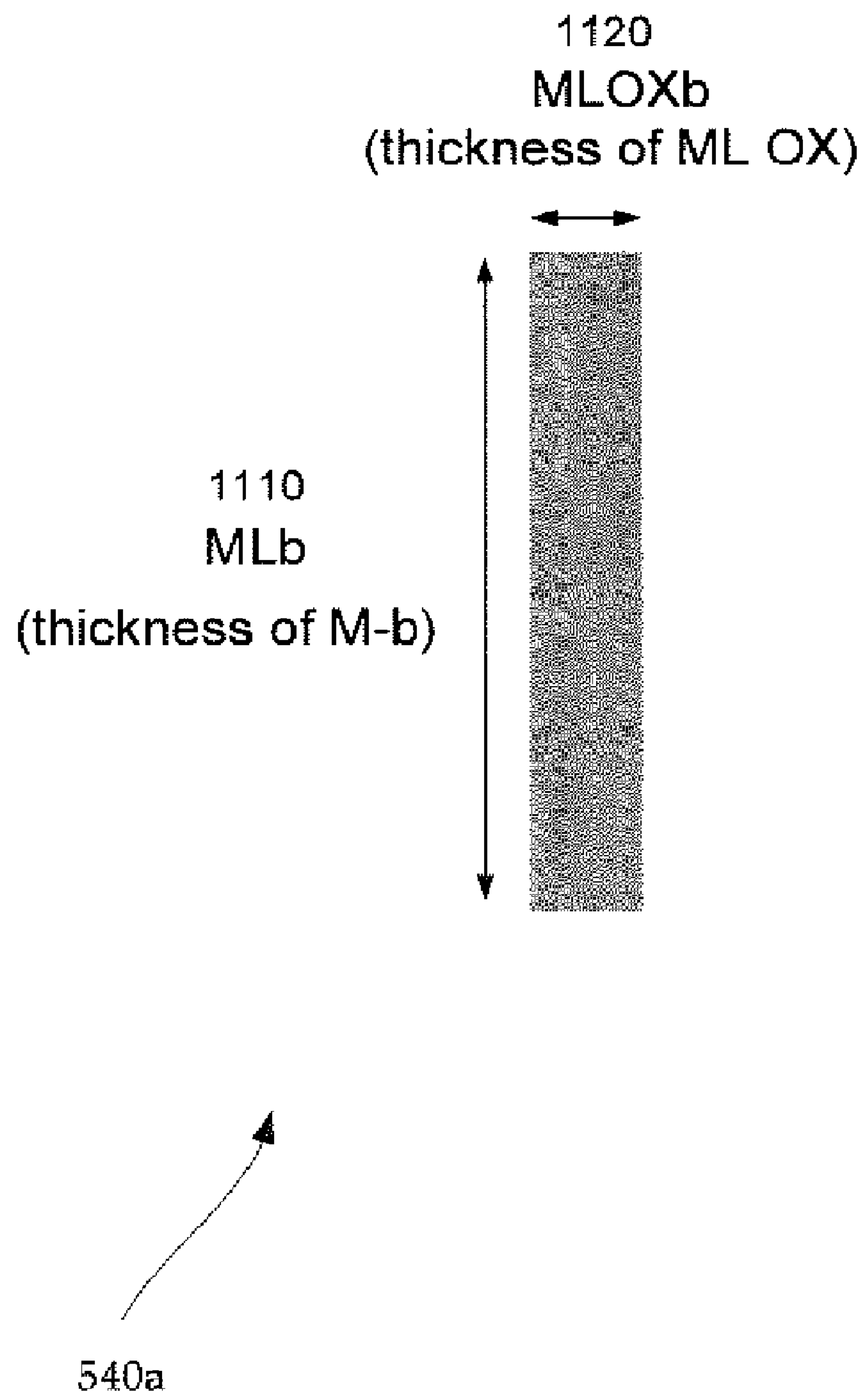
FIG. 11 is a process diagram illustrating the computation of the resistance Rb in the second resistance random access memory member in accordance with the present invention.

FIG. 11 is a process diagram illustrating the computation of the resistance Rb in the resistance random access memory member 440. The resistance Rb is a function of the parameters MLb 1110 and MLOXb 1120, represented mathematically as Rb=MLOXb/MLb, where the parameter MLb 1110 denotes the thickness of the second metal segment 440 (or the approximate thickness of the second metal layer 340) and the parameter MLOXb 1120 denotes the thickness of metal oxide 540. The thickness of MLb 1110 affects the resistance value of the Rb. The thinner the MLb 1110, the larger the value of Rb. The thickness of MLOXb 1120 also affects the resistance value of the Rb. A larger amount of oxidation of MLOXb 1120 results in a larger Rb value. In sum, the thinner the MLb 1110 deposition and the larger the MLOXb 1120 oxidation, the larger the resistance value of Rb. Therefore, the Rb resistance value can be controlled by deposition of a thin Mlb 1110, while oxidizing more of MLOXb 1120.

Figure 12:
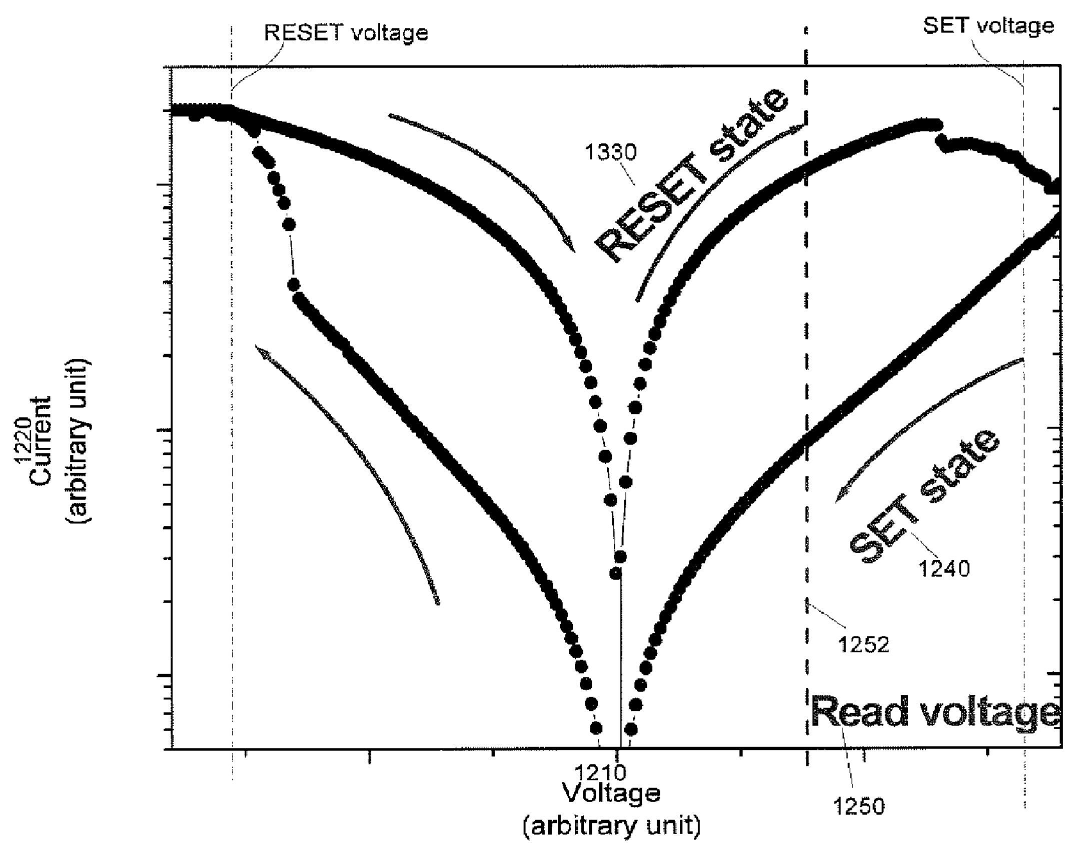
FIG. 12 is a graph showing an exemplary I-V curve in a bistable resistance random access memory with one resistance random access memory layer with the x-axis representing voltage and the y-axis representing current in accordance with the present invention.

FIG. 12 is a graph 1200 showing an exemplary I-V curve in a bistable resistance random access memory with one resistance random access memory layer with the x-axis representing voltage 1210 and the y-axis representing current 1220. In a RESET state 1230, the resistance random access memory layer is in a low resistance state. In a SET state 1240, the resistance random access memory layer is in a high resistance state. In this example, the SET/RESET window of the resistance random access memory layer is about one order of magnitude of a read voltage 1250. The read voltage 1250, illustrated with a dotted line 1252, shows a significant gap between a high current state (or high logic state) and a low current state (or a low logic state). From the RESET state 1230, after a voltage stress, the current in the RESET state 1230 swings upward to high current. From the SET state 1240, the current in the SET state 1240 swings downward. The large swing in the current drop from a low state to a high state, or from a high state to a low state makes it difficult to realize different logic multilevel states with a voltage controller. Instead, different resistance random access memory layers are connected in series, where each resistance random access memory layer has its own area or own resistance, for use in realizing the different logic states in a bistable resistance random access memory.

Figure 13:
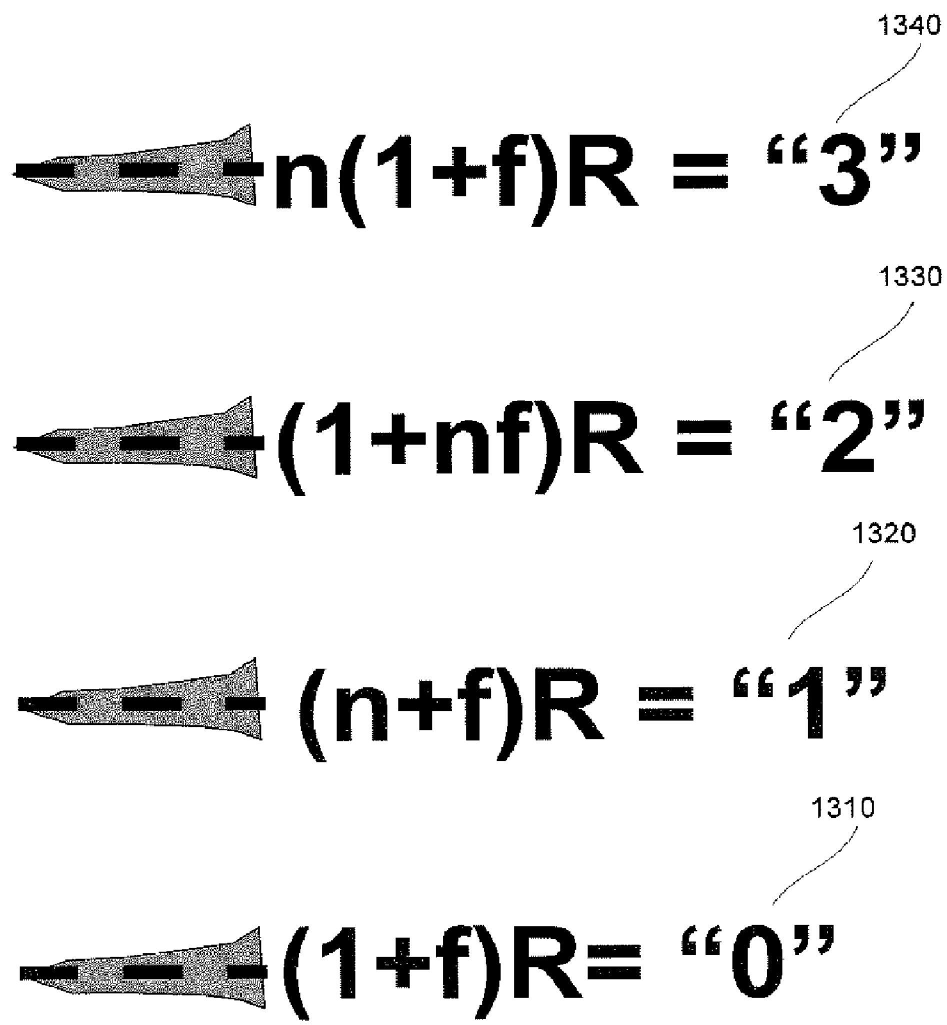
FIG. 13 illustrates mathematical relationships between the four logic states in the bistable resistance random access memory having two resistance random access memory members in series to provide four logic states, and two bits per memory cell in accordance with the present invention.

FIG. 13 illustrates mathematical relationships for the four logic states in the bistable resistance random access memory 900 having two resistance random access memory members in series to provide four logic states, and two bits per memory cell. Three variables R, n, and f are used in formulating the resistance relationship, where the variable R represents the RESET resistance of one memory member, the variable n is associated with the character of a resistance random access memory material, and the variable f is associated with the thickness of a dielectric spacer. In other words, the variable n depends on the properties associated with a selected material. The variable f can be controlled by dielectric spacer thickness. In the logic state "0" 1310, the total resistance of the bistable resistance random access memory 900 is about (1+f) R. In the logic state "1" 1320, the total resistance of the bistable resistance random access memory 900 is about (n+f) R. In the logic state "2" 1330, the total resistance of the bistable resistance random access memory 900 is about (1+nf)R. In the logic state "3" 1340, the total resistance of the bistable resistance random access memory 900 is about n(1+f)R. The variable f is tuned to fit with the resistance variation so that there is an operation window sufficient for a 2-bit operation in the bistable resistance random access memory 900. For example, the 2-bit operation windows described above show the following resistance: 3R, 12R, 21R to 30R. If the variable n=100, and the variable f=2, the 2-bit operation window would be computed to be 3R, 102R, 201R and 300R.

Figure 14:
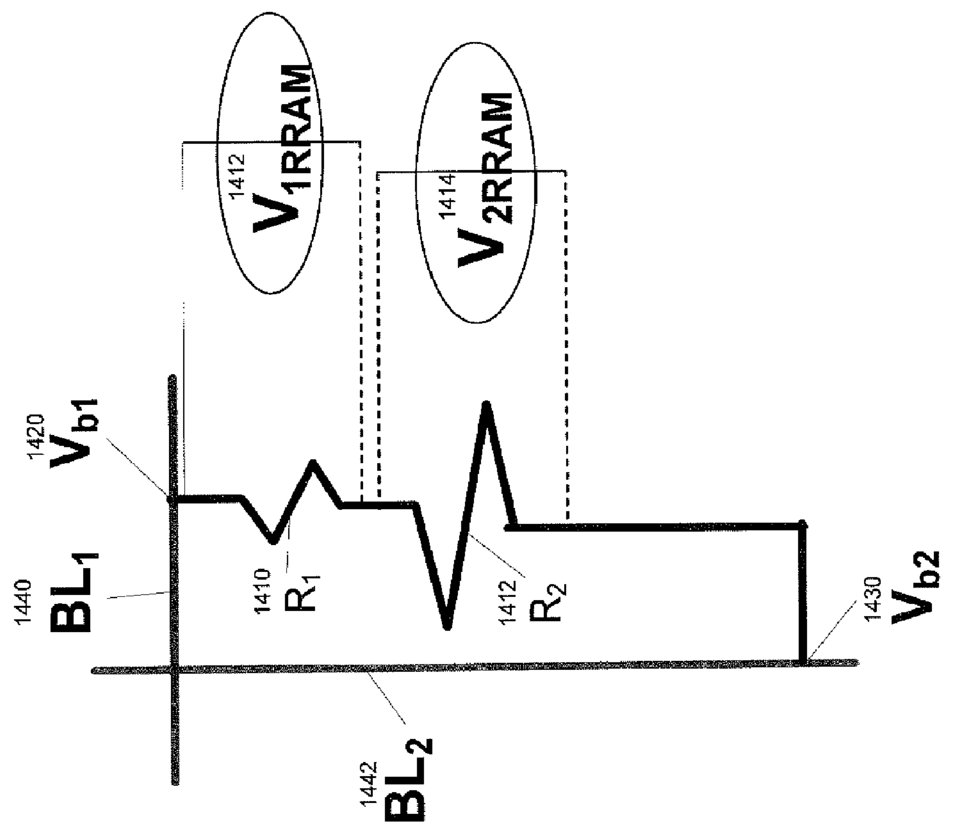
FIG. 14 is a simplified circuit diagram illustrating an equivalent circuit of the bistable resistance random access memory to reach different logic states in accordance with the present invention.

As illustrated in FIG. 14, bit line voltages are applied to the bistable resistance random access memory 900 to reach different logic states. The structure 900 of FIG. 9 can be represented schematically by the equivalent circuit of FIG. 14. In FIG. 14, the first resistance random access layer is positioned on top of the second resistance random access layer, rather than having the first resistance random access segment 420 positioned below the second resistance random access segment 440, as shown in FIG. 9. In this example, two resistance random access memory layers are described, and additional memory layers and corresponding bit line voltages may be added. The circuit 1400 has a first resistor $R_1$ 1410 representing the resistance of the first programmable resistance random access memory segment or member 420, and a second resistor $R_2$ 1412 representing the resistance of the second programmable resistance random access segment or member, connected between a first bit line voltage $V_{b1}$ 1420 that is associated with a first bit line $BL_1$ 1440 and a second bit line voltage $V_{b2}$ 1430 that is associated with a second bit line $BL_2$ 1442. The first bit line voltage $V_{b1}$ 1420 is connected to a top surface of the first resistance random access memory R1 1410 and the second bit line voltage $V_{b2}$ 1430 is connected to the bottom surface of the second programmable resistance random access memory member 1412. In this embodiment, the bistable resistance random access memory 900 comprises two resistance random access memory layers, which have two voltages associated with the first resistance random access member 420 and the second resistance random access member 440, represented by the symbol $V_{1RRAM}$ 1412 as a first voltage associated with the first resistance random access member 1410 and the symbol $V_{2RRAM}$ 1414 as a second voltage associated with the second resistance random access member 1412. The first programmable resistance random access voltage $V_{1RRAM}$ 1412 has a first terminal connected to the top of the first resistance random access member 1410 and a second terminal connected to the bottom of the first programmable resistance random access memory member 1410. The second programmable resistance random access memory voltage $V_{2RRAM}$ 1414 has a first terminal commonly connected to the bottom of the first programmable resistance random access memory member 1410, the top of the second programmable resistance random access member 1412, and the first programmable resistance random access voltage $V_{1RRAM}$ 1412, and a second terminal connected to the bottom of the second programmable resistance random access memory member 1412. Additional programmable resistance random access members and programmable resistance random access memory voltages can be added without departing from the spirit of the present invention.

When the bistable resistance random access memory 900 is reset, i.e. in a RESET state, the bistable resistance random access memory 900 starts at the logic "0" state (or "00" state). The bistable resistance random access memory 900 can be programmed from the logic "0" state to the logic "1" state (or "01" state), or from the logic "0" state to the logic "2" state (or "10" state), or from the logic "0" state to the logic "3" state (or "11" state).

In programming the bistable resistance random access memory 900 from the logic "00" state to the logic "10" state, a first voltage is applied on a first bit line to the first bit line voltage $V_{b1}$ 1420 and a second voltage is applied on a second bit line to the second bit line voltage $V_{b2}$ 1430. The voltage applied to the first bit line voltage $V_{b1}$ 1420 can be either zero volts, or a small negative voltage. The voltage difference between the first bit line voltage $V_{b1}$ 1420 and the second bit line voltage $V_{b2}$ 1430 is equal to the sum of the first resistance random access member voltage $V_{1RRAM}$ 1412 and the second resistance random access member voltage $V_{2RRAM}$ 1414, represented mathematically as follows: $V_{b2}-V_{b1}=V_{2RRAM}+$ $V_{1RRAM}=V_{low}$. The initial state for both the first resistance random access member 420 and the second resistance random access member 440 is a RESET state, i.e, a low resistance state. In this embodiment, the first resistance random access member 420 has a smaller area than the second resistance random access member 440. Therefore, the first resistance random access member 420 has a higher resistance than the second resistance random access member 440. This in turn means that the first resistance random access memory voltage $V_{1RRAM}$ 1412 is a value that is greater than the second resistance random access memory voltage $V_{2RRAM}$ 1414, represented in mathematical relationship as $V_{1RRAM}>V_{2RRAM}$. If the first resistance random access memory voltage $V_{1RRAM}$ 1412 is greater than a set voltage ($V_{1RRAM}>V_{SET}$), the first resistance random access memory member 420 changes from a RESET state to a SET state (i.e., high resistance). If the second resistance random access memory voltage $V_{2RRAM}$ 1414 is less than a set voltage ($V_{2RRAM}<V_{SET}$), the second resistance random access memory member 420 is kept at the RESET state. The resistance in the first resistance random access memory member 420 changes from the logic "0" state (or "00" state) having the resistance of (1+f)R to the logic "2" state (or "10" state) having the resistance of (1+nf)R. For example, if the variable f=2, the variable n=10, and the RESET resistance of the second resistance random access memory member 510 is equal to R, the amount of resistance would change from 3R to 21R.

In programming the bistable resistance random access memory 900 from logic "0" state (or "00" state) to a "3" state (or an "11" state), a first voltage is applied on a first bit line to the first bit line voltage $V_{b1}$ 1420 and a second voltage is applied on a second bit line to the second bit line voltage $V_{b2}$ 1430. The voltage applied to the first bit line voltage $V_{b1}$ 1420 can be either zero volts, or a small negative voltage. The initial state for both the first resistance random access member 420 and the second resistance random access member 440 is a RESET state, i.e, a low resistance state. The voltage difference between the first bit line voltage $V_{b1}$ 1420 and the second bit line voltage $V_{b2}$ 1430 is sufficiently high ($V_{high}$) so that both the first resistance random access member voltage $V_{1RRAM}$ 1412 and the second resistance random access member voltage $V_{2RRAM}$ 1414 are higher than $V_{SET}$ for both the first resistance random access memory member 420 and the second resistance random access memory member 440. Both the first resistance random access memory member 420 and the second resistance random access memory member 440 change resistance states from the RESET state to the SET state. The resistance in the first and second resistance random access memory members 420, 440 changes from the logic "0" state ("00" state) having the resistance of (1+f)R to the logic "3" state ("11" state) having the resistance of n(1+f)R. For example, if the variable f=2, the variable n=10, and the RESET resistance of the second resistance random access memory member 440 is equal to R, then the amount of resistance would change from 3R to 30R.

In programming the bistable resistance random access memory 900 from the logic "0" state (or "00" state) to the "1" state (or "01" state), the bistable random access memory 900 first goes through the sequence in changing from the logic "0" state (or "00" state) to the logic "3" state (or "11" state) in which both the first and second resistance random access memory members 420, 440 are changed from a RESET state to a SET state The voltage applied to the second bit line voltage $V_{b2}$ 1430 can be either zero volts or a small negative voltage, represented mathematically as follows: $V_{b2}-V_{b1}=-V_{low}<0$. The first bit line voltage $V_{b1}$ 1420 is supplied with a positive voltage. At the SET state, the first resistance random access memory member 420 has a smaller area than the second resistance random access memory member 440 so that the first resistance random access memory member 420 has a higher resistance than the second resistance random access memory member 440. This in turn means that a higher voltage drop occurs across the first resistance random access memory member 420, represented mathematically as $|V_{1RRAM}|>|V_{2RRAM}|$. If the absolute value of the first resistance random access memory voltage $V_{1RRAM}$ 1412 is greater than the RESET voltage ($|V_{1RRAM}|>V_{RESET}$), the first resistance random access memory voltage 420 is changed to the RESET state (low resistance). If the absolute value of the second resistance random access memory voltage $V_{2RRAM}$ 1414 is less than the RESET voltage ($|V_{2RRAM}|<V_{RESET}$), the second resistance random access memory member 440 is maintained at the SET state. The resistance in the first and second resistance random access memory members 420, 440 changes from the logic "3" state (or "11" state) having the resistance of n(1+f)R to the logic "1" state (or "01" state) having the resistance of (n+f)R. For example, if the variable f=2, the variable n=10, and the RESET resistance of the second resistance random access memory member 440 is equal to R, then the amount of resistance would change from 3R to 30R when the logic state changes from "0" to "3," and would change from 30R to 12R when the logic state changes from "3" to "1."

The two resistances, $R_1$ 1410 and $R_2$ 1412, are arranged in series between two bit lines, $BL_1$ 1440 and $BL_2$ 1442. Voltage applied to the respective bit lines is indicated by $V_{b1}$ 1420 and $V_{b2}$ 1430, respectively, and the voltage drop across the two resistances is $V_{1RRAM}$ 1412 and $V_{2RRAM}$ 1414; the voltage drop between the two bit lines is thus $V_{b2}-V_{b1}$, which equals $V_{1RRAM}+V_{2RRAM}$. As indicated on the drawing, the area of the first RRAM member 420 is smaller than that of the second RRAM member 440, and therefore the resistance $R_1$ is greater than $R_2$.

TABLE 1

| States | | Values |
|---|---|---|
| $R_1$ | $R_2$ | Cell Value |
| RESET | RESET | 0 ("00") |
| RESET | SET | 1 ("01") |
| SET | RESET | 2 ("10") |
| SET | SET | 3 ("11") |

Combinations of RRAM states, and their resulting cell values, are shown in Table 1. The cell values correspond to relative overall resistance values.

It should be noted that the embodiment shown in Table 1 follows a "small-endian" structure. That is, the last element is the least significant digit (LSD) and the first is the most significant digit (MSD). Other embodiments follow a "big-endian" model, in which the digits are reversed, and the processes set out below are identical, but the two memory elements are reversed.

Figure 15:
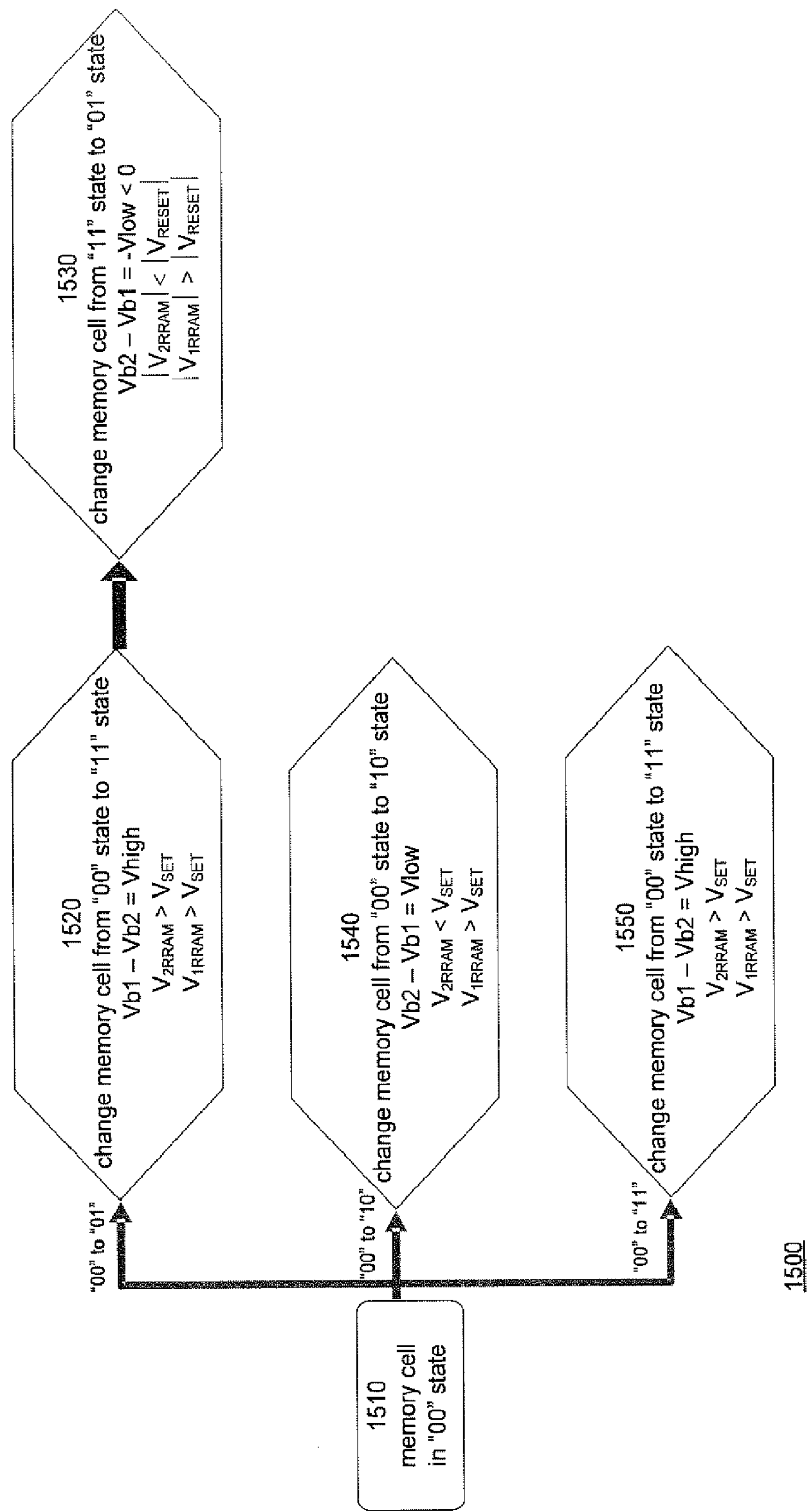
FIG. 15 is a flow diagram illustrating the programming of the bistable resistance random access memory from the logic "00" state to the three other logic states, the logic "01" state, the logic "10" state, and the logic "11" state in accordance with the present invention.

FIG. 15 is a flow diagram 1500 illustrating the programming of the bistable resistance random access memory 900 from the logic "00" state to the three other logic states, the logic "01" state, the logic "10" state, and the logic "11" state. At step 1510, the bistable resistance random access memory 900 is in the logic "00" state. If the bistable resistance random access memory 900 is programmed from the logic "00" state to the logic "01" state, the bistable resistance random access memory 900 is first programmed from the logic "00" state to the "11" state at step 1520, and second programmed from the logic “11” state at to the logic “01” state at step 1530. At step 1520 in which the bistable resistance random access memory 900 is programmed from the logic “00” state to the logic “11” state, the differential voltage between the first bit line voltage $V_{b1}$ 1420 and the second bit line voltage $V_{b2}$ 1430 is equal to a high voltage $V_{high}$ represented mathematically as $V_{b1}-V_{b2}=V_{high}$, the second resistance random access memory voltage $V_{2RRAM}$ 1414 is greater than the $V_{SET}$ voltage, and the first resistance random access memory voltage $V_{1RRAM}$ 1412 is greater than the $V_{SET}$ voltage. At step 1530 in which the bistable resistance random access memory 900 is programmed from the logic “11” state to the logic “01” state, the differential voltage between the first bit line voltage $V_{b1}$ 1420 and the second bit line voltage $V_{b2}$ 1430 is equal to a negative low voltage $-V_{low}$, represented mathematically as $V_{b2}-V_{b1}=-V_{low}$, the absolute value of the second resistance random access memory voltage $V_{2RRAM}$ 1414 is less than the absolute value of the $V_{RESET}$ voltage, and the absolute value of the first resistance random access memory voltage $V_{1RRAM}$ 1412 is greater than the absolute value of the $V_{RESET}$ voltage.

At step 1540 in which the bistable resistance random access memory 900 is programmed from the logic “00” state to the logic “10” state, the differential voltage between the first bit line voltage $V_{b1}$ 1420 and the second bit line voltage $V_{b2}$ 1430 is equal to a low voltage $V_{low}$, represented mathematically as $V_{b2}-V_{b1}=V_{low}$, the second resistance random access memory voltage $V_{2RRAM}$ 1414 is less than the $V_{SET}$ voltage, and the first resistance random access memory voltage $V_{1RRAM}$ 1412 is greater than the $V_{SET}$ voltage. At step 1550 in which the bistable resistance random access memory 900 is programmed from the logic “00” state to the logic “11” state, the differential voltage between the first bit line voltage $V_{b1}$ 1420 and the second bit line voltage $V_{b2}$ 1430 is equal to the high voltage $V_{high}$, represented mathematically as $V_{b1}-V_{b2}=V_{high}$, the second resistance random access memory voltage $V_{2RRAM}$ 1414 is greater than the $V_{SET}$ voltage, and the first resistance random access memory voltage $V_{1RRAM}$ 1412 is greater than the $V_{SET}$ voltage.

Figure 16:
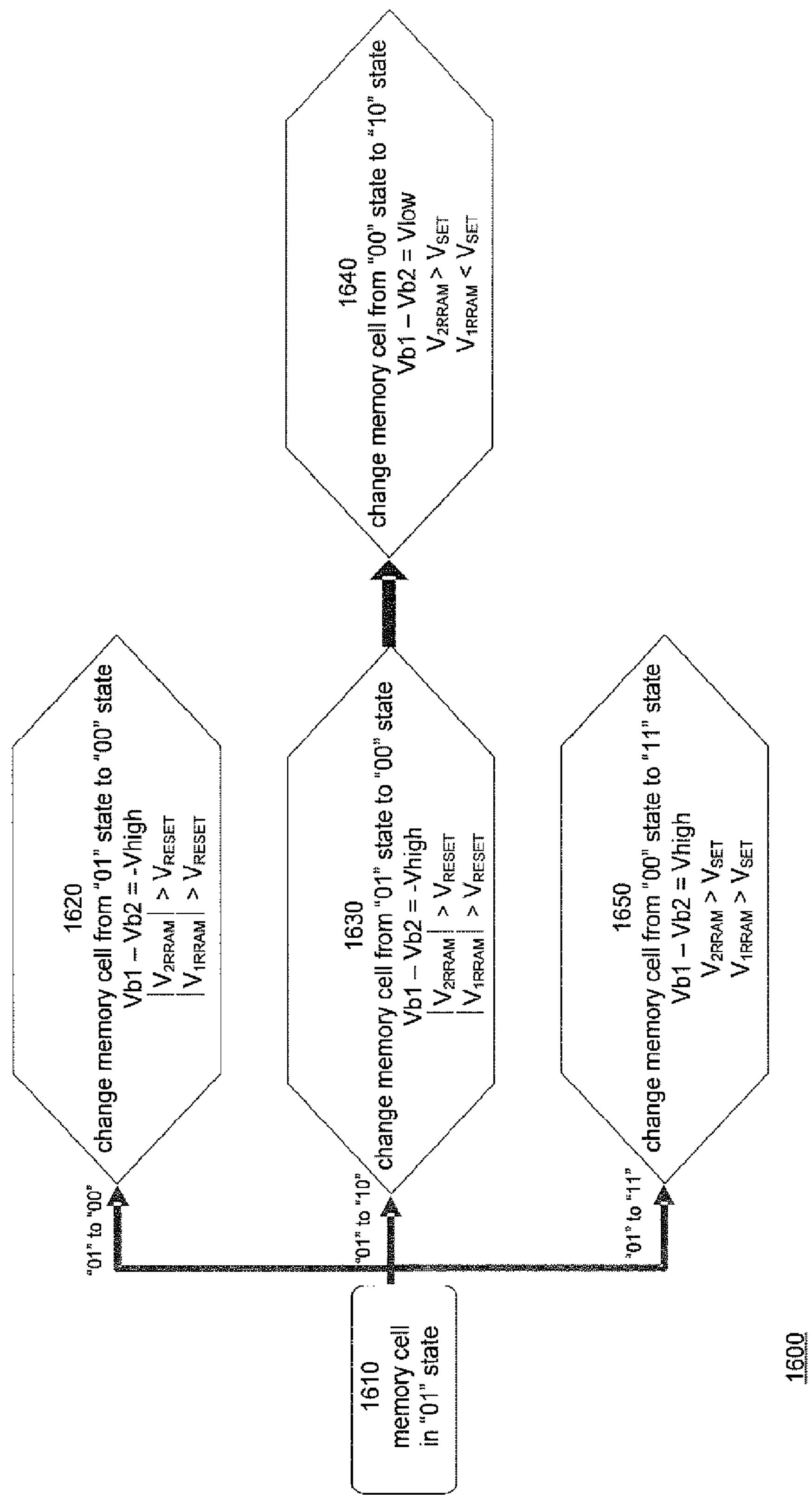
FIG. 16 is a flow diagram illustrating the programming of the bistable resistance random access memory from the logic "01" state to the three other logic states, the logic "00" state, the logic "10" state and the logic "11" state in accordance with the present invention.

FIG. 16 is a flow diagram 1600 illustrating the programming of the bistable resistance random access memory 900 from the logic “01” state to the three other logic states, the logic “00” state, the logic “10” state, and the logic “11” state. At step 1610, the bistable resistance random access memory 900 is in the logic “01” state. At step 1620 in which the bistable resistance random access memory 900 is programmed from the logic “01” state to the logic “00” state, the differential voltage between the first bit line voltage $V_{b1}$ 1420 and the second bit line voltage $V_{b2}$ 1430 is equal to a negative high voltage $-V_{high}$, represented mathematically as $V_{b1}-V_{b2}=-V_{high}$, the absolute value of the second resistance random access memory voltage $V_{2RRAM}$ 1414 is greater than the $V_{RESET}$ voltage, and the absolute value of the first resistance random access memory voltage $V_{1RRAM}$ 1412 is greater than the $V_{RESET}$ voltage.

If the bistable resistance random access memory 900 is programmed from the logic “01” state to the logic “10” state, the bistable resistance random access memory 900 is first programmed from the logic “01” state to the “00” state at step 1630, and second programmed from the logic “00” state at to the logic “10” state at step 1640. At step 1630 in which the bistable resistance random access memory 900 is programmed from the logic “01” state to the logic “00” state, the differential voltage between the first bit line voltage $V_{b1}$ 1420 and the second bit line voltage $V_{b2}$ 1430 is equal to a negative high voltage $-V_{high}$, represented mathematically as $V_{b1}-V_{b2}=-V_{high}$, the absolute value of the second resistance random access memory voltage $V_{2RRAM}$ 1414 is greater than the $V_{RESET}$ voltage, and the absolute value of the first resistance random access memory voltage $V_{1RRAM}$ 1412 is greater than the $V_{RESET}$ voltage. At step 1640 in which the bistable resistance random access memory 900 is programmed from the logic “00” state to the logic “10” state, the differential voltage between the first bit line voltage $V_{b1}$ 1420 and the second bit line voltage $V_{b2}$ 1430 is equal to the low voltage $V_{low}$, represented mathematically as $V_{b1}-V_{b2}=V_{low}$, the second resistance random access memory voltage $V_{2RRAM}$ 1414 is greater than the $V_{RESET}$ voltage, and the first resistance random access memory voltage $V_{1RRAM}$ 1412 is less than the $V_{RESET}$ voltage.

At step 1650 in which the bistable resistance random access memory 900 is programmed from the logic “01” state to the logic “11” state, the differential voltage between the first bit line voltage $V_{b1}$ 1420 and the second bit line voltage $V_{b2}$ 1430 is equal to the high voltage $V_{high}$, represented mathematically as $V_{b1}-V_{b2}=V_{high}$, the second resistance random access memory voltage $V_{2RRAM}$ 1414 is greater than the $V_{SET}$ voltage, and the first resistance random access memory voltage $V_{1RRAM}$ 1412 is greater than the $V_{SET}$ voltage.

Figure 17:
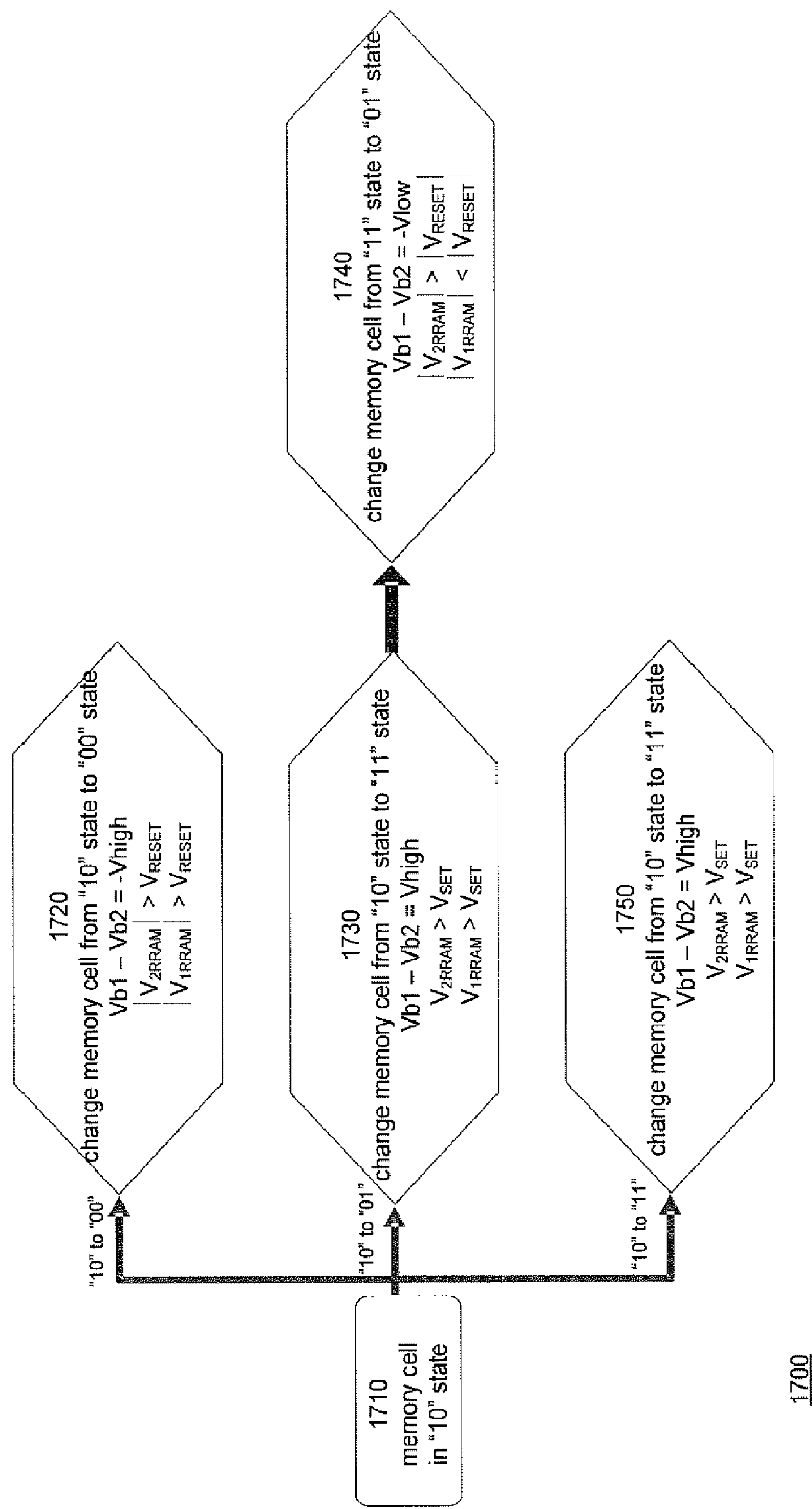
FIG. 17 is a flow diagram illustrating the programming of the bistable resistance random access memory from the logic "10" state to the three other logic states, the logic "00" state, the logic "01" state and the logic "11" state in accordance with the present invention.

FIG. 17 is a flow diagram 1700 illustrating the programming of the bistable resistance random access memory 900 from the logic “10” state to the three other logic states, the logic “00” state, the logic “01” state, and the logic “11” state. At step 1710, the bistable resistance random access memory 900 is in the logic “10” state At step 1720 in which the bistable resistance random access memory 900 is programmed from the logic “10” state to the logic “00” state, the differential voltage between the first bit line voltage $V_{b1}$ 1420 and the second bit line voltage $V_{b2}$ 1430 is equal to a negative high voltage $-V_{high}$, represented mathematically as $V_{b1}-V_{b2}=-V_{high}$, the absolute value of the second resistance random access memory voltage $V_{2RRAM}$ 1414 is greater than the $V_{RESET}$ voltage, and the absolute value of the first resistance random access memory voltage $V_{1RRAM}$ 1412 is greater than the $V_{RESET}$ voltage.

If the bistable resistance random access memory 900 is programmed from the logic “10” state to the logic “01” state, the bistable resistance random access memory 900 is first programmed from the logic “10” state to the “11” state at step 1730, and second programmed from the logic “11” state at to the logic “01” state at step 1740. At step 1730 in which the bistable resistance random access memory 900 is programmed from the logic “10” state to the logic “11” state, the differential voltage between the first bit line voltage $V_{b1}$ 1420 and the second bit line voltage $V_{b2}$ 1430 is equal to a high voltage $V_{high}$ represented mathematically as $V_{b1}-V_{b2}=V_{high}$, the second resistance random access memory voltage $V_{2RRAM}$ 1414 is greater than the $V_{SET}$ voltage, and the first resistance random access memory voltage $V_{1RRAM}$ 1412 is greater than the $V_{SET}$ voltage. At step 1740 in which the bistable resistance random access memory 900 is programmed from the logic “11” state to the logic “10” state, the differential voltage between the first bit line voltage $V_{b1}$ 1420 and the second bit line voltage $V_{b2}$ 1430 is equal to the negative low voltage $-V_{low}$, represented mathematically as $V_{b1}-V_{b2}=-V_{low}$, the absolute value of the second resistance random access memory voltage $V_{2RRAM}$ 1414 is greater than the absolute value of the $V_{RESET}$ voltage, and the absolute value of the first resistance random access memory voltage $V_{1RRAM}$ 1412 is less than the absolute value of the $V_{RESET}$ voltage.

At step 1750 in which the bistable resistance random access memory 900 is programmed from the logic “10” state to the logic “11” state, the differential voltage between the first bit line voltage $V_{b1}$ 1420 and the second bit line voltage $V_{b2}$ 1430 is equal to the high voltage $V_{high}$, represented mathematically as $V_{b1}-V_{b2}=V_{high}$, the second resistance random access memory voltage $V_{2RRAM}$ 1414 is greater than the $V_{SET}$ voltage, and the first resistance random access memory voltage $V_{1RRAM}$ 1412 is greater than the $V_{SET}$ voltage.

Figure 18:
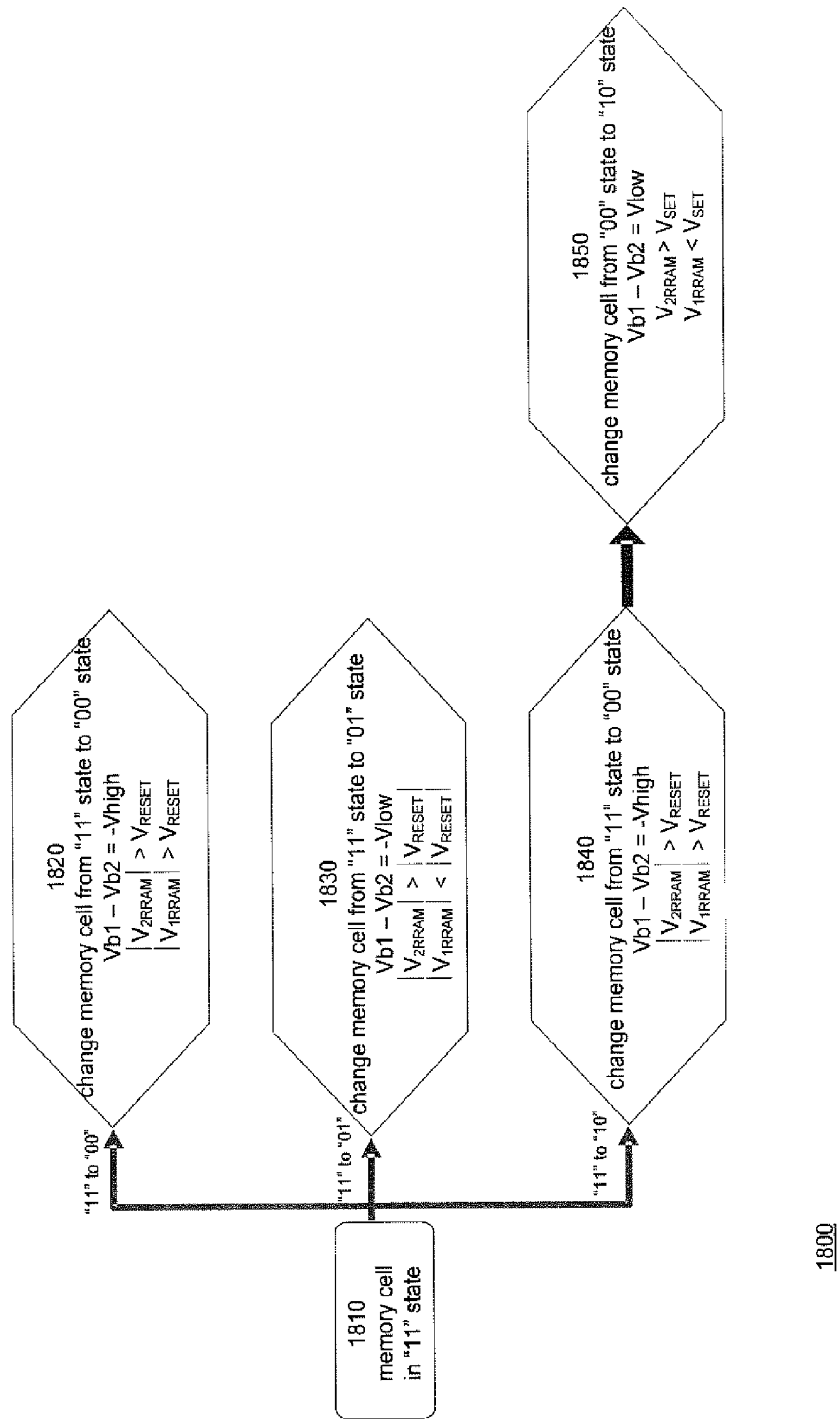
FIG. 18 is a flow diagram illustrating the programming of the bistable resistance random access memory from the logic "11" state to the three other logic states, the logic "00" state, the logic "01" state, and the logic "10" state in accordance with the present invention.

FIG. 18 is a flow diagram 1800 illustrating the programming of the bistable resistance random access memory 900 from the logic "11" state to the three other logic states, the logic "00" state, the logic "01" state, and the logic "10" state. At step 1810, the bistable resistance random access memory 900 is in the logic "11" state. At step 1820 in which the bistable resistance random access memory 900 is programmed from the logic "11" state to the logic "00" state, the differential voltage between the first bit line voltage $V_{b1}$ 1420 and the second bit line voltage $V_{b2}$ 1430 is equal to a negative high voltage $-V_{high}$, represented mathematically as $V_{b1}-V_{b2}=-V_{high}$, the absolute value of the second resistance random access memory voltage $V_{2RRAM}$ 1414 is greater than the $V_{RESET}$ voltage, and the absolute value of the first resistance random access memory voltage $V_{1RRAM}$ 1412 is greater than the $V_{RESET}$ voltage.

At step 1830 in which the bistable resistance random access memory 900 is programmed from the logic "11" state to the logic "01" state, the differential voltage between the first bit line voltage $V_{b1}$ 1420 and the second bit line voltage $V_{b2}$ 1430 is equal to the negative low voltage $-V_{low}$, represented mathematically as $V_{b1}-V_{b2}=-V_{low}$, the absolute value of the second resistance random access memory voltage $V_{2RRAM}$ 1414 is greater than the absolute value of the $V_{RESET}$ voltage, and the absolute value of the first resistance random access memory voltage $V_{1RRAM}$ 1412 is less than the absolute value of the $V_{RESET}$ voltage.

If the bistable resistance random access memory 900 is programmed from the logic "11" state to the logic "10" state, the bistable resistance random access memory 900 is first programmed from the logic "11" state to the "00" state at step 1840, and second programmed from the logic "00" state at to the logic "10" state at step 1850. At step 1740 in which the bistable resistance random access memory 900 is programmed from the logic "11" state to the logic "00" state, the differential voltage between the first bit line voltage $V_{b1}$ 1420 and the second bit line voltage $V_{b2}$ 1430 is equal to the negative high voltage $-V_{high}$, represented mathematically as $V_{b1}-V_{b2}=-V_{high}$, the absolute value of the second resistance random access memory voltage $V_{2RRAM}$ 1414 is greater than the $V_{RESET}$ voltage, and the absolute value of the first resistance random access memory voltage $V_{1RRAM}$ 1412 is greater than the $V_{RESET}$ voltage. At step 1850 in which the bistable resistance random access memory 900 is programmed from the logic "00" state to the logic "10" state, the differential voltage between the first bit line voltage $V_{b1}$ 1420 and the second bit line voltage $V_{b2}$ 1430 is equal to the negative low voltage $V_{low}$, represented mathematically as $V_{b1}-V_{b2}=V_{low}$, the second resistance random access memory voltage $V_{2RRAM}$ 1414 is greater than the $V_{SET}$ voltage, and the first resistance random access memory voltage $V_{1RRAM}$ 1412 is less than the $V_{SET}$ voltage.

The present invention is applicable to multi-level cell (MLC) memory that stores more than one bit per cell. The multi-level cell comprises multiple charge trapping sites where each trapping site is capable of storing one or more bits. For example, a multi-level cell has a first charge trapping site at a first position and a second charge trapping site at a second position wherein the first position is spaced apart from the second position. If there are two RRAM layers for the first charge trapping site and the second charge trapping site, the MLC memory stores 2 bits of information and provides four resistance states.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method of forming a multi-level cell (MLC) resistance random access memory (RRAM) structure, comprising:

depositing a first programmable resistive memory member having a thickness t1, the first programmable resistive memory member having a resistance Ra, the resistance Ra correlating with the thickness t1 of the first programmable resistive memory member;

forming an insulating member over the first programmable resistive memory member;

depositing over the insulating member a second programmable resistive memory member having a thickness t2, the second programmable resistive memory member having a resistance Rb, the resistance Rb correlating with the thickness t2 of the second programmable resistive memory member; and oxidizing the first programmable resistive memory member to form a first metal oxide strip at a first position of the first programmable resistive memory member and form a second metal oxide strip at a second position of the first programmable resistive memory member, the first metal oxide strip having a vertical thickness MLa and a horizontal thickness MLOXa.

2. The method of claim 1, further comprising oxidizing the second programmable resistive memory member to form a third metal oxide strip at a first position of the second programmable resistive memory member and form a fourth metal oxide strip at a second position of the second programmable resistive memory member, the third metal oxide strip having a vertical thickness MLb and a horizontal thickness MLOXb.

3. The method of claim 2, wherein the resistance Ra is a function of the vertical thickness MLa of the first metal oxide strip and the horizontal thickens MLOXa of the first metal oxide strip, represented mathematically as Ra=MLOXa/MLa.

4. The method of claim 3, wherein the resistance Rb is a function of the vertical thickness MLa of the third metal oxide strip and the horizontal thickness MLOXb of the third metal oxide strip, is represented mathematically as Rb=MLOXb/MLb.

5. The method of claim 2, further comprising forming a first interconnect metal liner electrically connecting the first metal oxide strip of the first programmable resistive memory member to the third metal oxide strip of the second programmable resistive memory member.

6. The method of claim 5, further comprising forming a second interconnect metal liner electrically connecting the second metal oxide strip of the first programmable resistive memory member to the fourth metal oxide strip of the second programmable resistive memory member.

7. The method of claim 6, further comprising an incoming electrical current entering the second programmable resistive memory member and splitting into a first current and a second current in the second programmable resistive memory member, wherein the first current flows through the third metal oxide strip, down the first interconnect metal liner, through the first metal oxide strip, across the first programmable resistive memory member, wherein the second current flows through the fourth metal oxide strip, down the second interconnect metal liner, through the second metal oxide strip, across the first programmable resistive memory member, and wherein the first and second currents merge into an output electrical current.

8. The method of claim 6, further comprising determining a total resistance Rs by summing the resistance Ra and the resistance Rb and dividing the sum by 2, represented mathematically as Rs=(Ra+Rb)/2.

9. The method of claim 2, further comprising forming a first interconnect metal oxide electrically connecting the first metal oxide strip of the first programmable resistive memory member to the third metal oxide strip of the second programmable resistive memory member.

10. The method of claim 9, further comprising forming a second interconnect metal oxide electrically connecting the second metal oxide strip of the first programmable resistive memory member to the fourth metal oxide strip of the second programmable resistive memory member, the first interconnect metal oxide having a resistance Rc.

11. The method of claim 10, further comprising an incoming electrical current entering the second programmable resistive memory member and splitting into a first current and a second current in the second programmable resistive memory member, wherein the first current flows through the third metal oxide strip, down the first interconnect metal oxide, through the first metal oxide strip, across the first programmable resistive memory member, wherein the second current flows through the fourth metal oxide strip, down the second interconnect metal liner, through the second metal oxide strip, across the first programmable resistive memory member, and wherein the first and second currents merge into an output electrical current.

12. The method of claim 10, further comprising determining a total resistance Rs by summing the resistances, Ra, Rb and Rc, and dividing the sum by 2, represented mathematically as Rs=(Ra+Rb+Rc)/2.

13. The method of claim 6, further comprising forming a cap member over the second programmable resistive memory member.

14. The method of claim 13, further comprising forming a spacer around the first and second metal liners and the cap member.

15. The method of claim 14, further comprising removing the cap member leaving a void; and forming second spacers above the second programmable resistive memory member.

16. The method of claim 15, further comprising depositing a conductive material into the void and between the second spacers, the conductive material contacting the second programmable resistive memory member.

17. The method of claim 16, further comprising an electrical current flowing through the conductive material, splitting into a first component and a second component in the second programmable resistive memory member, the first component flowing through the first metal liner and the second component flowing through the second metal liner, and the first component recombining with the second component in a terminal connected to the first programmable resistive memory member.

18. A method of forming a memory cell, comprising:

providing a bottom electrode;

forming a first programmable layer over the bottom electrode, the first programmable layer having first and second memory elements;

forming a dielectric layer immediately over the first programmable layer;

forming a second programmable layer immediately over the dielectric layer; the second programmable layer having third and fourth memory elements; and forming a top electrode over the second programmable layer, wherein the bottom electrode, the first and second programmable layers and the top electrode are in electrical series.

* * * * *